United States Patent
Jang et al.

(10) Patent No.: US 9,191,176 B2
(45) Date of Patent: Nov. 17, 2015

(54) METHOD FOR CODING AND TRANSMITTING UPLINK CONTROL INFORMATION IN A WIRELESS ACCESS SYSTEM

(75) Inventors: Jiwoong Jang, Anyang-si (KR); Jinmin Kim, Anyang-si (KR); Seunghee Han, Anyang-si (KR); Jaehoon Chung, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 142 days.

(21) Appl. No.: 14/001,015

(22) PCT Filed: Feb. 23, 2012

(86) PCT No.: PCT/KR2012/001391
§ 371 (c)(1),
(2), (4) Date: Aug. 22, 2013

(87) PCT Pub. No.: WO2012/115465
PCT Pub. Date: Aug. 30, 2012

(65) Prior Publication Data
US 2013/0322398 A1    Dec. 5, 2013

Related U.S. Application Data

(60) Provisional application No. 61/445,548, filed on Feb. 23, 2011.

(51) Int. Cl.
*H04Q 7/00*       (2006.01)
*H04L 5/00*       (2006.01)
(Continued)

(52) U.S. Cl.
CPC .............. *H04L 5/0057* (2013.01); *H03M 13/09* (2013.01); *H03M 13/6516* (2013.01);
(Continued)

(58) Field of Classification Search
CPC ... H04L 1/0026; H04L 1/0072; H04L 5/0057; H04L 1/1861; H04L 5/001; H04L 27/2636; H04L 1/0041; H04L 1/0057; H04L 1/0061; H03M 13/09; H03M 13/6516; H03M 13/6525
USPC ................................. 370/328, 329
See application file for complete search history.

(56) References Cited

U.S. PATENT DOCUMENTS 8,171,372 B2 * 5/2012 Pan ............................. 714/758
8,565,162 B2 * 10/2013 Tiirola et al. ................ 370/329
(Continued)

OTHER PUBLICATIONS

3GPP, "Technical Specification Group Radio Access Network; Evolved Universal Terrestrial Radio Access (E-UTRA); Multiplexing and channel coding (Release 10)", 3GPP TS 36.212 V10.0.0, Dec. 2010, pp. 1-72.

*Primary Examiner* — Chuong T Ho
(74) *Attorney, Agent, or Firm* — Birch, Stewart, Kolasch & Birch, LLP

(57) ABSTRACT

The present invention relates to a method for transmitting channel quality control information using two transmission blocks in a wireless access system that supports hybrid automatic retransmit request (HARQ). The method for transmitting channel quality control information according to one embodiment of the present invention comprises: a step in which a terminal receives a physical downlink control channel (PDCCH) signal including downlink control information (DCI); a step of calculating, using the DCI, the number (Q') of encoded symbols required for transmitting channel quality control information; and a step of transmitting the channel quality control information via the physical downlink control channel (PDCCH) based on the number of encoded symbols.

10 Claims, 20 Drawing Sheets

(51) Int. Cl.
*H04L 1/00* (2006.01)
*H03M 13/09* (2006.01)
*H03M 13/00* (2006.01)
*H04L 1/18* (2006.01)
*H04L 27/26* (2006.01)
*H04L 25/03* (2006.01)
*H04B 7/06* (2006.01)

(52) U.S. Cl.
CPC ........ *H03M 13/6525* (2013.01); *H04L 1/0026* (2013.01); *H04L 1/0041* (2013.01); *H04L 1/0057* (2013.01); *H04L 1/0061* (2013.01); *H04L 1/0072* (2013.01); *H04L 1/1861* (2013.01); *H04L 5/001* (2013.01); *H04L 27/2636* (2013.01); *H04B 7/063* (2013.01); *H04B 7/0632* (2013.01); *H04L 5/0046* (2013.01); *H04L 5/0048* (2013.01); *H04L 5/0053* (2013.01); *H04L 5/0055* (2013.01); *H04L 25/03828* (2013.01)

(56) References Cited

U.S. PATENT DOCUMENTS

| | | | | |
|---|---|---|---|---|
| 8,572,461 | B2 * | 10/2013 | Pan | 714/758 |
| 8,707,129 | B2 * | 4/2014 | Pan | 714/758 |
| 8,724,648 | B2 * | 5/2014 | Zeng et al. | 370/436 |
| 8,989,069 | B2 * | 3/2015 | Xu et al. | 370/311 |
| 9,048,998 | B2 * | 6/2015 | Pan | 1/1 |
| 2008/0232321 | A1 * | 9/2008 | Tiirola et al. | 370/329 |
| 2009/0006925 | A1 * | 1/2009 | Pan | 714/758 |
| 2009/0190528 | A1 | 7/2009 | Chung et al. | |
| 2009/0199055 | A1 | 8/2009 | Chen et al. | |
| 2009/0296644 | A1 * | 12/2009 | Cheon et al. | 370/329 |
| 2009/0316626 | A1 * | 12/2009 | Lee et al. | 370/328 |
| 2011/0216628 | A1 * | 9/2011 | Nalla et al. | 368/21 |
| 2013/0091401 | A1 * | 4/2013 | Pan | 714/755 |
| 2013/0279449 | A1 * | 10/2013 | Pan | 370/329 |
| 2014/0189464 | A1 * | 7/2014 | Pan | 714/758 |

* cited by examiner (a)

(b)

(a)

(b)

METHOD FOR CODING AND TRANSMITTING UPLINK CONTROL INFORMATION IN A WIRELESS ACCESS SYSTEM

CROSS-REFERENCE TO RELATED APPLICATIONS

This application is the National Phase of PCT/KR2012/001391 filed on Feb. 23, 2012, which claims priority under 35 U.S.C. 119(e) to U.S. Provisional Application No. 61/445,548 filed on Feb. 23, 2011, all of which are hereby expressly incorporated by reference into the present application.

TECHNICAL FIELD

The present invention relates to a wireless communication system, and more particularly, to methods and apparatuses for encoding Uplink Control Information (UCI) including channel quality control information and transmitting the encoded UCI in a Carrier Aggregation (CA) environment (i.e. a multi-component carrier environment). The present invention also relates to a channel coding method for use in transmitting UCI on a Physical Uplink Shared Channel (PUSCH).

BACKGROUND ART

A $3^{rd}$ Generation Partnership Project Long Term Evolution (3GPP LTE: Rel-8 or Rel-9) system adopts Multi-Carrier Modulation (MCM) in which a single Component Carrier (CC) is divided into a plurality of frequency bands. On the other hand, a 3GPP LTE-Advanced system (hereinafter, referred to as an LTE-A system) may use CA by aggregating one or more CCs to support a broader system bandwidth than in the 3GPP LTE system. The term CA may be interchanged with carrier matching, multi-CC environment, or multi-carrier environment.

For a single-CC environment such as the LTE system, only multiplexing of UCI and data using a plurality of layers on one CC is specified.

In contrast, one or more CCs are available and the number of pieces of UCI may be multiplied by the number of used CCs. For example, a Rank Indication (RI) has 2-bit or 3-bit information in the LTE system. Since a total bandwidth can be extended to up to 5 CCs in the LTE-A system, the RI may have 15-bit information at maximum.

In this case, as large UCI as 15 bits cannot be transmitted in a UCI transmission scheme defined in the LTE system and cannot be encoded with a conventional Reed-Muller (RM) code. Accordingly, there exists a need for a new method for transmitting UCI having a large amount of information in the LTE-A system.

Moreover, the LTE system gives no regard to a precoding index, when UCI is transmitted on a PUSCH. Therefore, a method for transmitting a precoding index has not been specified.

If a precoding index associated with multiple CCs and UCI are multiplexed into a PUSCH in the CA environment, the multiple CCs increase the size of the UCI. In addition, since information about the precoding index associated with the multiple CCs is added to the UCI, the size of the UCI further increases.

However, a shortcoming with conventional methods lies in that UCI is encoded only with an RM code or an 8-bit Cyclic Redundancy Check (CRC) irrespective of the increasing size of the UCI.

DISCLOSURE

Technical Problem

An object of the present invention devised to solve the conventional problem is to provide a method for efficiently encoding Uplink Control Information (UCI) and transmitting the encoded UCI in a Carrier Aggregation (CA) environment (or a multi-carrier environment).

Another object of the present invention is to provide an efficient channel coding method for a case where a precoding index associated with multiple Component Carriers (CCs) is multiplexed with a PUSCH signal in a CA environment.

Another object of the present invention is to provide a method for determining whether to apply a Cyclic Redundancy Check (CRC) to Channel Quality Indication/Precoding Matrix Index (CQI/PMI) information and what CRC to be used.

Another object of the present invention is to provide an efficient resource allocation method, a transmission structure, and a joint/separate coding method for UCI and a precoding index in a CA environment.

Another object of the present invention is to provide a User Equipment (UE) apparatus and/or a Base Station (BS) apparatus for supporting the above methods.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

The present invention relates to methods and apparatuses for transmitting Uplink Control Information (UCI) including channel quality control information in a Carrier Aggregation (CA) environment.

In an aspect of the present invention, a method for transmitting channel quality control information in a wireless access system includes steps of attaching Cyclic Redundancy Check (CRC) bits to the channel quality control information, taking into account a size of the CRC bits and a size of the channel quality control information, channel-encoding the channel quality control information attached with the CRC bits, and transmitting the channel-encoded channel quality control information on a Physical Uplink Shared Channel (PUSCH) to a base station.

In another aspect of the present invention, a user equipment for transmitting channel quality control information in a wireless access system includes a transmission module for transmitting a wireless signal, a reception module for receiving a wireless signal, and a processor for supporting transmission of the channel quality control information.

The processor is configured to attach CRC bits to the channel quality control information, taking into account a size of the CRC bits and a size of the channel quality control information and to channel-encode the channel quality control information attached with the CRC bits. The UE transmits the channel-encoded channel quality control information on a PUSCH to a base station through the transmission module.

The channel quality control information may include at least one of Channel Quality Indication (CQI) information and Precoding Matrix Index (PMI) information.

If a sum of the size of the channel quality control information and the size of the CRC bits is equal to or less than 128, the CRC bits may be 8 bits.

If a sum of the size of the channel quality control information and the size of the CRC bits is equal to or larger than 129, the CRC bits may be 24 bits, and the 24-bit CRC may be $g_{CRC24A}(D)=[D^{24}+D^{23}+D^{18}+D^{17}+D^{14}+D^{11}+D^{10}+D^7+D^6+D^5+D^4+D^3+D+1]$, or $g_{CRC24B}(D)=[D^{24}+D^{23}+D^6+D^5+D+1]$.

If a sum of the size of the channel quality control information and the size of the CRC bits is equal to or larger than 129, the CRC bits may be 16 bits, and the 16-bit CRC may be $g_{CRC16}(D)=[D^{16}+D^{12}+D^5+1]$.

The afore-described aspects of the present invention are merely a part of preferred embodiments of the present invention. Those skilled in the art will derive and understand various embodiments reflecting the technical features of the present invention from the following detailed description of the present invention.

Advantageous Effects

The embodiments of the present invention have the following effects.

Firstly, a method for efficiently encoding and transmitting Uplink Control Information (UCI) in a Carrier Aggregation (CA) environment (or a multi-carrier environment is provided.

Secondly, when a precoding index associated with multiple Component Carriers (CCs) is multiplexed with a Physical Uplink Shared Channel (PUSCH) signal in a CA environment, channel coding can be performed efficiently.

Thirdly, when the size of UCI increases in a CA environment, whether to apply a Cyclic Redundancy Check (CRC) and what appropriate CRC to be added can be determined according to the size of Channel Quality Indication/Precoding Matrix Index (CQI/PMI) information. For example, as the size of a CQI/PMI increases, error detection cannot be guaranteed with a conventional 8-bit CRC. Therefore, the use of a CRC having more than 8 bits according to the size of the CQI/PMI can increase error detection performance.

Fourthly, an efficient resource allocation method, a transmission structure, and a joint/separate coding method for UCI and a precoding index in a CA environment can be provided.

It will be appreciated by persons skilled in the art that the effects that can be achieved with the present invention are not limited to what has been particularly described hereinabove and other advantages of the present invention will be more clearly understood from the following detailed description taken in conjunction with the accompanying drawings.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

BEST MODE FOR CARRYING OUT THE INVENTION

Figure 1:
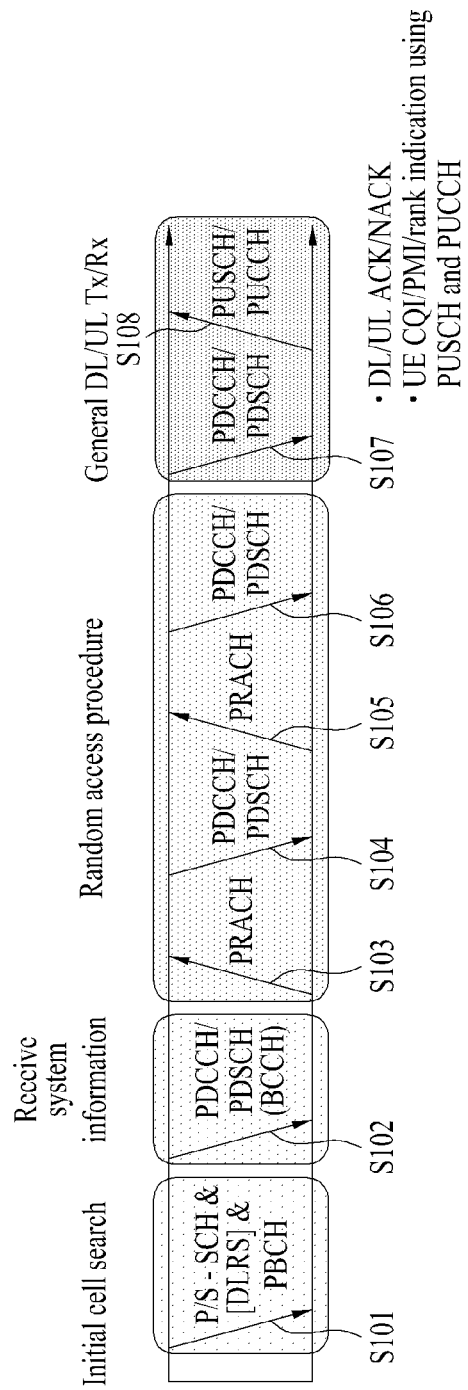
FIG. 1 illustrates physical channels and a general signal transmission method using the physical channels in a 3$^{rd}$ Generation Partnership Project Long Term Evolution (3GPP LTE) system.

Embodiments of the present invention relate to methods and apparatuses for encoding and transmitting Uplink Control Information (UCI) including channel quality control information in a Carrier Aggregation (CA) environment (i.e. a multi-carrier environment). Embodiments of the present invention also provide various channel coding methods and Cyclic Redundancy Check (CRC) adding methods for the case where UCI including Channel Quality Indication/Precoding Matrix Index (CQI/PMI) information is transmitted on a Physical Uplink Shared Channel (PUSCH).

The embodiments of the present invention described below are combinations of elements and features of the present invention in specific forms. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions or elements of any one embodiment may be included in another embodiment and may be replaced with corresponding constructions or features of another embodiment.

In the description of the attached drawings, a detailed description of known procedures or steps of the present invention will be avoided lest it should obscure the subject matter of the present invention. In addition, procedures or steps that could be understood to those skilled in the art will not be described either.

In the embodiments of the present invention, a description has been mainly made of a data transmission and reception relationship between a Base Station (BS) and a User Equipment (UE). A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an eNode B (eNB), an Advanced Base Station (ABS), an access point, etc.

The term terminal may be replaced with a UE, a Mobile Station (MS), a Subscriber Station (SS), a Mobile Subscriber Station (MSS), a mobile terminal, an Advanced Mobile Station (AMS), etc.

A transmitter is a fixed and/or mobile node that provides a data service or a voice service and a receiver is a fixed and/or mobile node that receives a data service or a voice service. Therefore, a UE may serve as a transmitter and a BS may serve as a receiver, on uplink. Likewise, the UE may serve as a receiver and the BS may serve as a transmitter, on downlink.

The embodiments of the present invention may be supported by standard documents disclosed for at least one of wireless access systems including an Institute of Electrical and Electronics Engineers (IEEE) 802.xx system, a $3^{rd}$ Generation Partnership Project (3GPP) system, a 3GPP Long Term Evolution (LTE) system, a 3GPP LTE-Advanced (LTE-A) system, and a 3GPP2 system. In particular, the embodiments of the present invention may be supported by 3GPP TS 36.211, 3GPP TS 36.212, 3GPP TS 36.213, and 3GPP TS 36.321 documents. That is, the steps or parts, which are not described to clearly reveal the technical idea of the present invention, in the embodiments of the present invention may be explained by the above documents. All terms used in the embodiments of the present invention may be explained by the standard documents.

While the following detailed description is given under the assumption that a 3GPP LTE system and/or a 3GPP LTE-A (LTE Advanced) system is being used as mobile communication system, the description is applicable to any other mobile communication system except for specific features inherent to the 3GPP LTE and/or 3GPP LTE-A system.

Reference will now be made in detail to the preferred embodiments of the present invention with reference to the accompanying drawings. The detailed description, which will be given below with reference to the accompanying drawings, is intended to explain exemplary embodiments of the present invention, rather than to show the only embodiments that can be implemented according to the invention.

The following detailed description includes specific details in order to provide a thorough understanding of the present invention. However, it will be apparent to those skilled in the art that the present invention may be practiced without such specific details.

The embodiments of the present invention can be used for various radio access technologies such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc.

UTRA is a part of Universal Mobile Telecommunications System (UMTS). 3GPP LTE is a part of Evolved UMTS (E-UMTS) using E-UTRA, and LTE-A is an evolution of 3GPP LTE. While the embodiments of the present invention are described in the context of a 3GPP LTE/LTE-A system in order to clarify the technical features of the present invention, the present invention is also applicable to an IEEE 802.16e/m system, etc.

1. Overview of 3GPP LTE/LTE-A System

In a wireless access system, a UE receives information from a BS on a DownLink (DL) and transmit information to the BS on an UpLink (UL). The information transmitted and received between the UE and the BS includes general data information and various types of control information. There are many physical channels according to the types/usages of information transmitted and received between the BS and the UE.

FIG. 1 illustrates physical channels and a general method for transmitting signals on the physical channels in the 3GPP system.

When a UE is powered on or enters a new cell, the UE performs initial cell search (S101). The initial cell search involves acquisition of synchronization to an eNB. Specifically, the UE synchronizes its timing to the eNB and acquires information such as a cell Identifier (ID) by receiving a Primary Synchronization Channel (P-SCH) and a Secondary Synchronization Channel (S-SCH) from the eNB.

Then the UE may acquire information broadcast in the cell by receiving a Physical Broadcast Channel (PBCH) from the eNB. During the initial cell search, the UE may monitor a DL channel state by receiving a Downlink Reference Signal (DL RS).

After the initial cell search, the UE may acquire more detailed system information by receiving a Physical Downlink Control Channel (PDCCH) and receiving a Physical Downlink Shared Channel (PDSCH) based on information of the PDCCH (S102).

To complete access to the eNB, the UE may perform a random access procedure with the eNB (S103 to S106). In the random access procedure, the UE may transmit a preamble on a Physical Random Access Channel (PRACH) (S103) and may receive a response message to the preamble on a PDCCH and a PDSCH associated with the PDCCH (S104). In the case of a contention-based random access, the UE may additionally perform a contention resolution procedure including transmission of an additional PRACH (S105) and reception of a PDCCH signal and a PDSCH signal corresponding to the PDCCH signal (S106).

After the above procedure, the UE may receive a PDCCH and/or a PDSCH from the eNB (S107) and transmit a Physical Uplink Shared Channel (PUSCH) and/or a Physical Uplink Control Channel (PUCCH) to the eNB (S108), in a general UL/DL signal transmission procedure.

Information that the UE transmits to the eNB is called Uplink Control Information (UCI). The UCI includes Hybrid Automatic Repeat and reQuest Acknowledgement/Negative Acknowledgement (HARQ-ACK/NACK), Scheduling Request (SR), Channel Quality Indication (CQI), Precoding Matrix Index (PMI), a Rank Indication (RI), etc.

In the LTE system, UCI is generally transmitted on a PUCCH periodically. However, if control information and traffic data should be transmitted simultaneously, they may be transmitted on a PUSCH. In addition, UCI may be transmitted periodically on the PUSCH, upon receipt of a request/command from a network.

Figure 2:
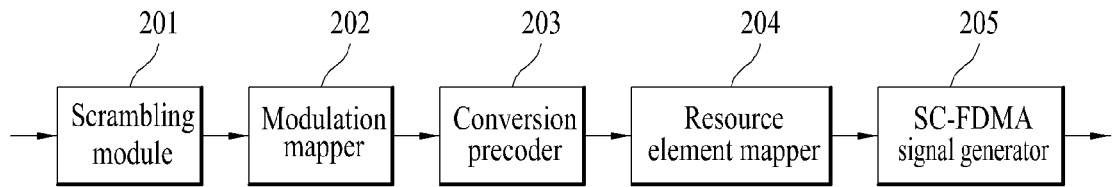
FIG. 2 illustrates a configuration of a User Equipment (UE) and a signal processing operation to transmit an uplink signal in the UE.

FIG. 2 illustrates a configuration of a UE and a signal processing operation to transmit an uplink signal in the UE.

To transmit a UL signal, a scrambling module 210 of the UE may scramble the transmission signal with a UE-specific scrambling signal. A modulation mapper 220 modulates the scrambled signal to complex symbols in Binary Phase Shift Keying (BPSK), Quadrature Phase Shift Keying (QPSK), or 16-ary Quadrature Amplitude Modulation (16QAM)/64-ary QAM (64QAM) according to the type of the transmission signal and/or a channel state. A Resource Element (RE) mapper 240 may map the complex symbols received from the modulation mapper 220 through a transform precoder 230 to time-frequency REs. The processed signal may be transmitted to an eNB through an antenna, after being processed in an SC-FDMA signal generator 250.

Figure 3:
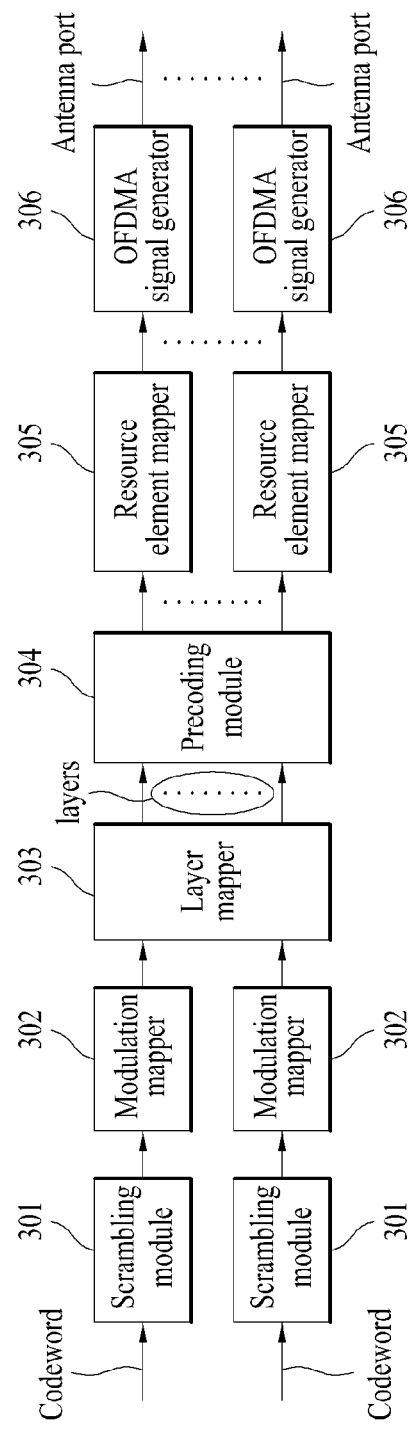
FIG. 3 illustrates a configuration of a Base Station (BS) and a signal processing operation to transmit a downlink signal in the BS.

FIG. 3 illustrates a configuration of an eNB and a signal processing operation to transmit a downlink signal in the eNB.

In the 3GPP LTE system, the eNB may transmit one or more codewords on a downlink. Each codeword may be processed to complex symbols through a scrambling module 301 and a modulation mapper 302, as done for the uplink in FIG. 2. Then the complex symbols are mapped to a plurality of layers by a layer mapper 303. Each layer may be multiplied by a precoding matrix in a precoding module 304 and allocated to transmission antennas. Each of the processed antenna-specific transmission signals may be mapped to time-frequency REs in an RE mapper 305 and transmitted through an antenna through an Orthogonal Frequency Division Multiplexing (OFDM) signal generator 306.

Compared to DL signal transmission from an eNB, a Peak-to-Average Power Ratio (PAPR) becomes a problem with UL signal transmission from a UE. As described before with reference to FIGS. 2 and 3, a UL signal is transmitted in SC-FDMA, while a DL signal is transmitted in OFDMA.

Figure 4:
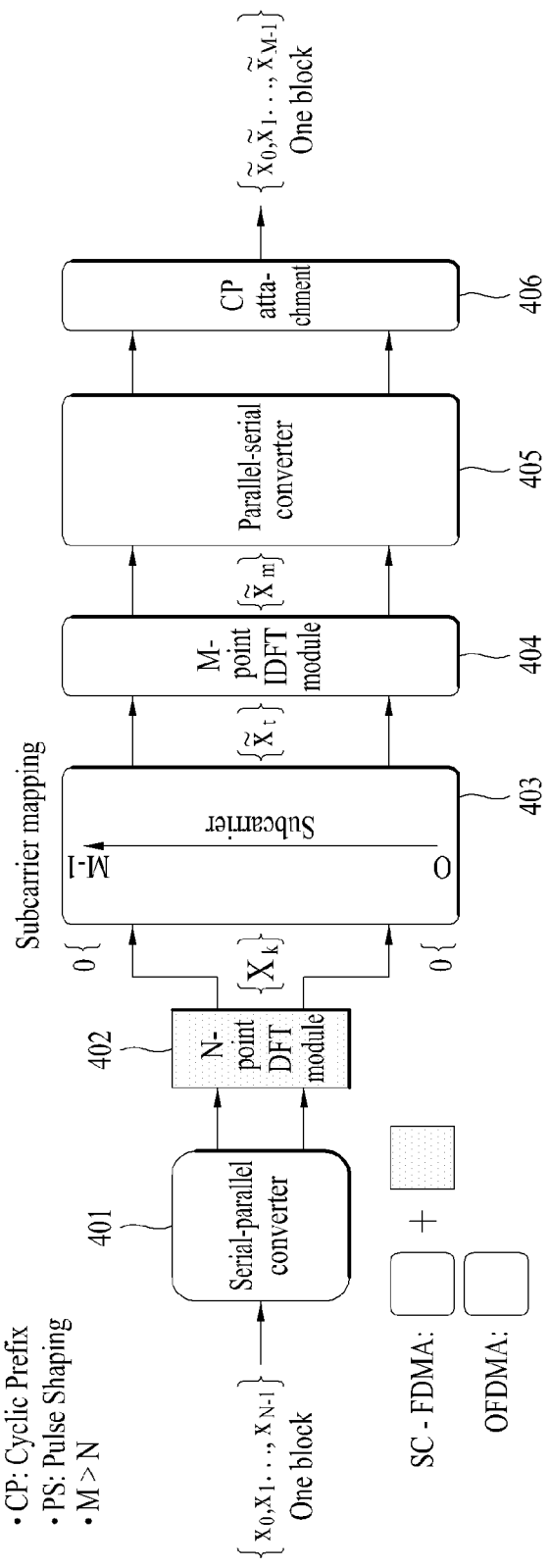
FIG. 4 illustrates a configuration of a UE and Single Carrier-Frequency Division Multiple Access (SC-FDMA) and Orthogonal Frequency Division Multiple Access (OFDMA) schemes.

FIG. 4 illustrates a configuration of a UE and SC-FDMA and OFDMA schemes.

A 3GPP system (e.g. the LTE system) adopts OFDMA for downlink and SC-FDMA for uplink. Referring to FIG. 4, a UE and an eNB are common in that each of the UE and the eNB has a serial-to-parallel converter 401, a subcarrier mapper 403, an M-point Inverse Discrete Fourier Transform (IDFT) module 404, and a Cyclic Prefix (CP) adding module 406 in order to transmit a UL signal or a DL signal.

To transmit a signal in SC-FDMA, the UE further includes an N-point Discrete Fourier Transform (DFT) module 402. The N-point DFT module 402 nullifies the effects of IDFT of the IDFT module 404 to some extent so that the transmission signal takes a single carrier property.

Figure 5:
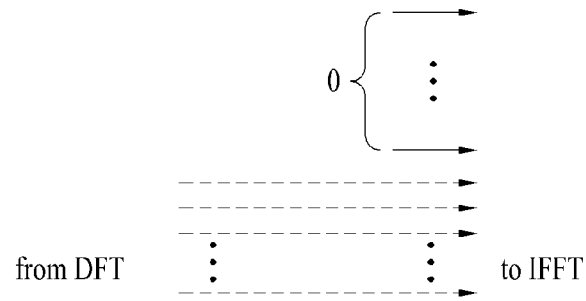
FIG. 5 illustrates frequency-domain signal mapping methods that satisfy a single carrier property in the frequency domain.
Figure 5:
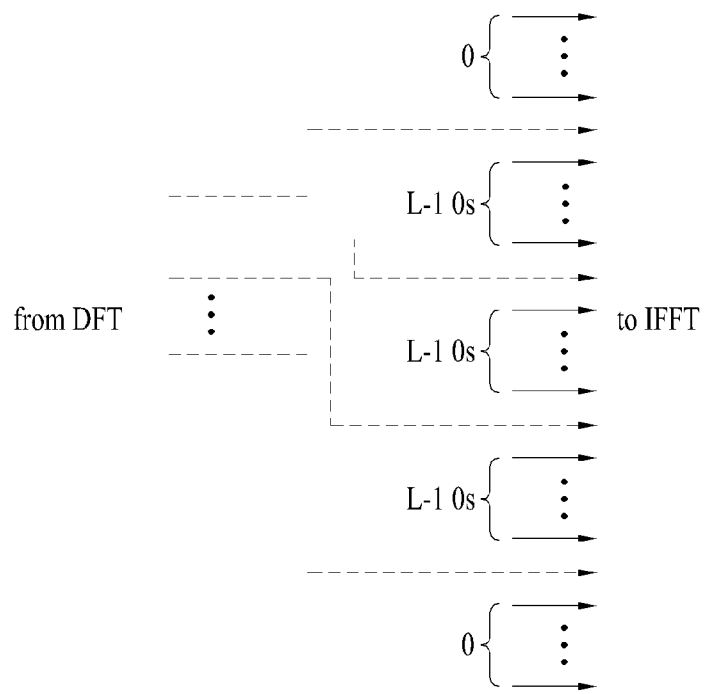

FIG. 5 illustrates frequency-domain signal mapping methods that satisfy a single carrier property in the frequency domain.

FIG. 5(a) illustrates a localized mapping scheme and FIG. 5(b) illustrates a distributed mapping scheme. In clustered SC-FDMA being a modification of SC-FDMA, DFT output samples are divided into sub-groups and mapped to the frequency domain (or a subcarrier domain) non-continuously during subcarrier mapping.

Figure 6:
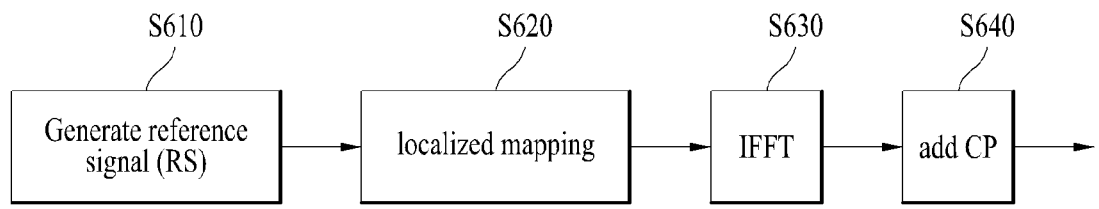
FIG. 6 is a block diagram illustrating an operation for transmitting a Reference Signal (RS) for use in demodulating an SC-FDMA transmission signal.

FIG. 6 is a block diagram illustrating transmission of a Reference signal (RS) for use in demodulating a signal transmitted in SC-FDMA.

According to the LTE standard (e.g. 3GPP release 8), while a time signal of data is converted to a frequency signal by DFT, mapped to subcarriers, Inverse Fast Fourier Transform (IFFT)-processed, and then transmitted (refer to FIG. 4), an RS is generated directly in the frequency domain without DFT processing (S601), mapped to subcarriers (S602), IFFT-processed (S603), attached with a Cyclic Prefix (CP) (S640), and then transmitted.

Figure 7:
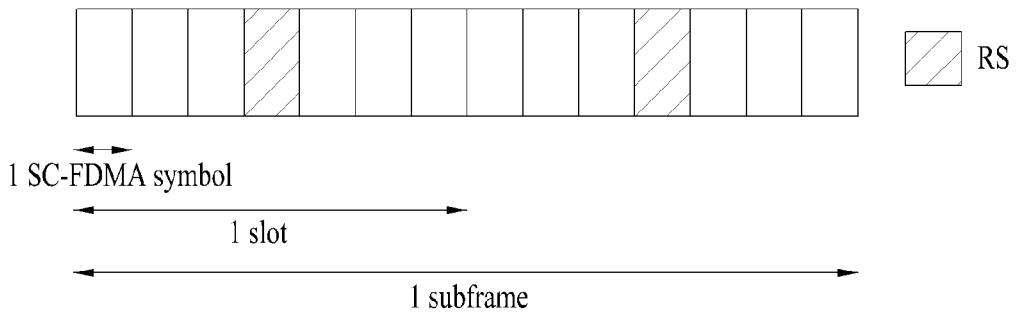
FIG. 7 illustrates the positions of symbols to which RSs are mapped in an SC-FDMA subframe structure.
Figure 7:
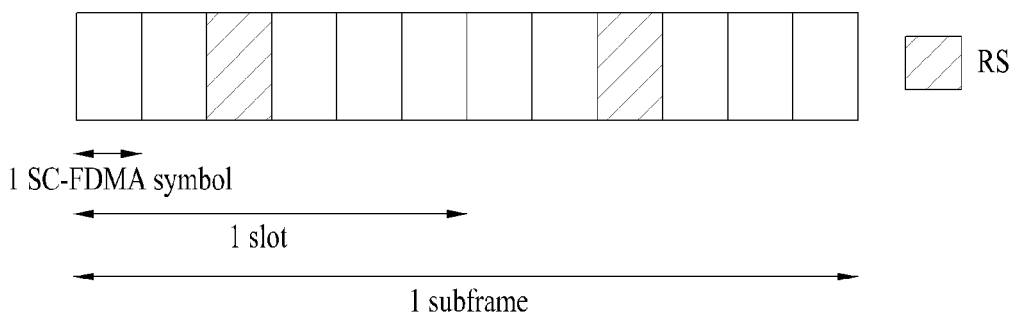

FIG. 7 illustrates the positions of symbols to which RSs are mapped in an SC-FDMA subframe structure.

FIG. 7(a) illustrates a case where an RS is positioned in the fourth SC-FDMA symbol of each of two slots in a subframe, when a normal CP is used. FIG. 7(b) illustrates a case where an RS is positioned in the third SC-FDMA symbol of each of two slots in a subframe, when an extended CP is used.

Figure 8:
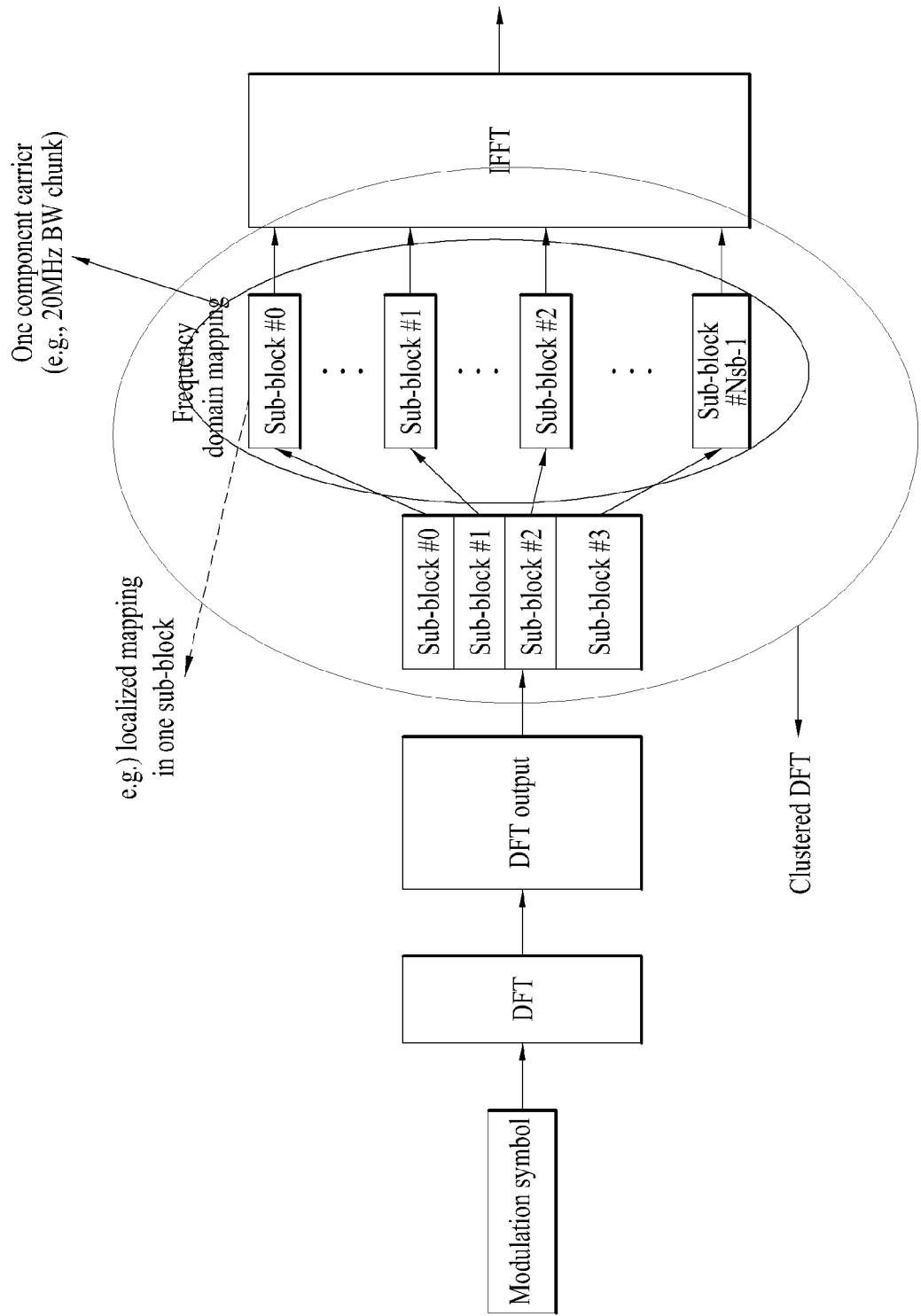
FIG. 8 illustrates a signal processing operation for mapping Discrete Fourier Transform (DFT) output samples to a single carrier in clustered SC-FDMA.
Figure 9:
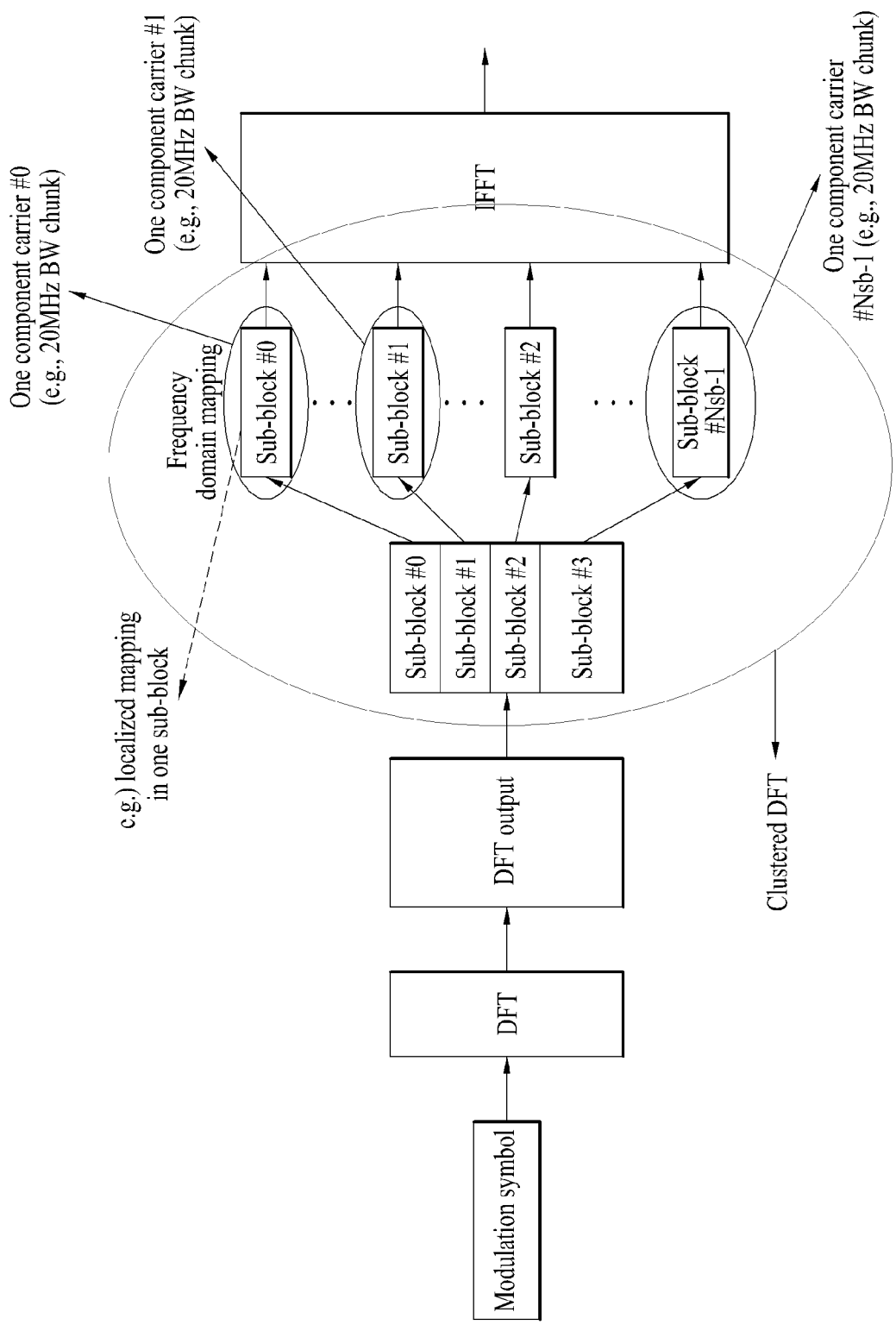
FIGS. 9 and 10 illustrate signal processing operations for mapping DFT output samples to multiple carriers in clustered SC-FDMA.
Figure 10:
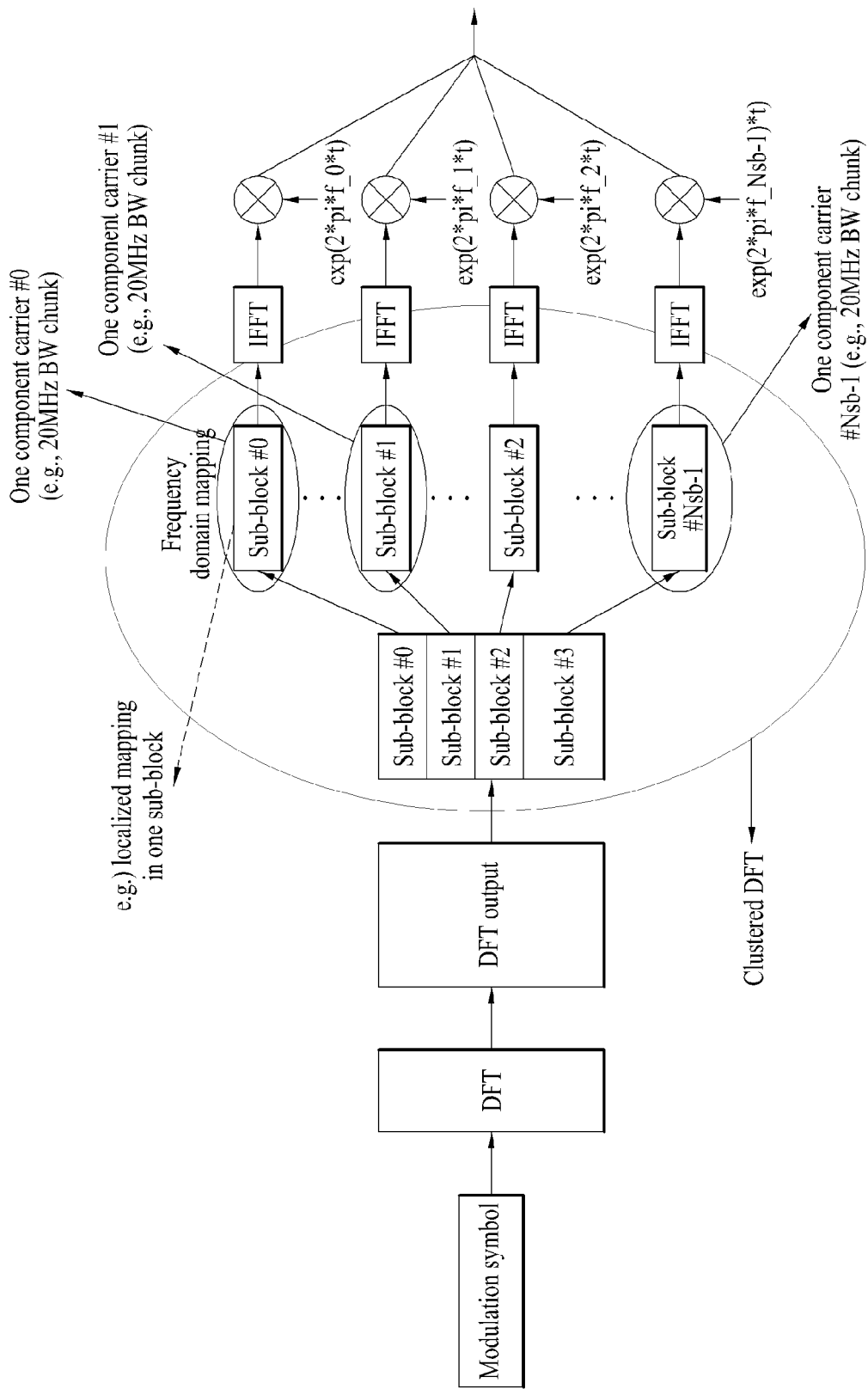

FIG. 8 illustrates a signal processing operation for mapping DFT output samples to a single carrier in clustered SC-FDMA. FIGS. 9 and 10 illustrate signal processing operations for mapping DFT output samples to multiple carriers in clustered SC-FDMA.

Figure 11:
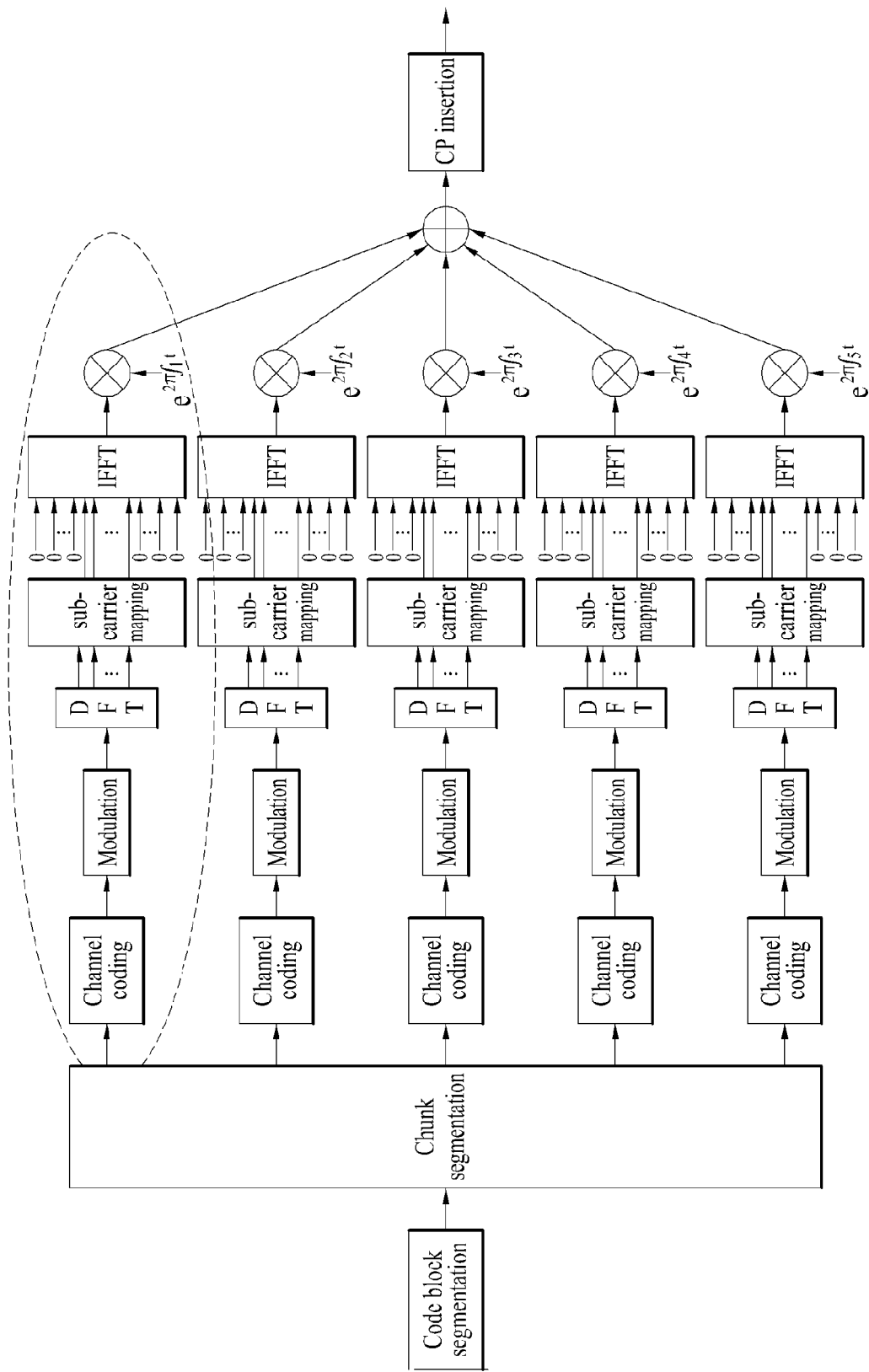
FIG. 11 illustrates a signal processing operation in segmented SC-FDMA.

FIG. 8 illustrates an example of intra-carrier clustered SC-FDMA and FIGS. 10 and 11 illustrate examples of inter-carrier SC-FDMA. In FIG. 9, with contiguous CCs allocated in the frequency domain, if a subcarrier spacing is aligned between adjacent CCs, a signal is generated from a single IFFT block. In FIG. 10, with non-contiguous CCs allocated in the frequency domain, signals are generated from a plurality of IFFT blocks.

FIG. 11 illustrates a segmented SC-FDMA signal processing operation.

In segmented SC-FDMA, as many IFFT modules as the number of DFT modules are used. Thus, DFT modules are mapped to IFFT modules in a one-to-one correspondence. Thus segmented SC-FDMA is an extension of the DFT spreading and IFFT frequency subcarrier mapping configuration of legacy SC-FDMA, also referred to as NxSC-FDMA or NxDFT-s-OFDMA. Herein, NxSC-FDMA and NxDFT-s-OFDMA are uniformly called segmented SC-FDMA. Referring to FIG. 11, to relieve the single carrier property constraint, total time-domain modulation symbols are grouped into N groups (N is an integer larger than 1) and DFT-processed on a group basis in segmented SC-FDMA.

Figure 12:
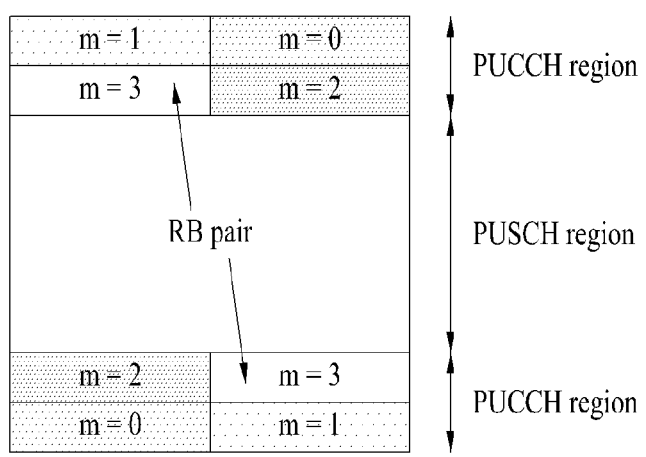
FIG. 12 illustrates an exemplary uplink subframe structure that can be used in embodiments of the present invention.

FIG. 12 illustrates an exemplary uplink subframe structure that can be used in embodiments of the present invention.

Referring to FIG. 12, an uplink subframe includes a plurality of (e.g. 2) slots. A slot may include a different number of SC-FDMA symbols according to a CP length. For example, a slot may include 7 SC-FDMA symbols in the case of a normal CP.

The uplink subframe is divided into a data region and a control region. A PUSCH signal is transmitted and received in the data region. The data region is also used to transmit a UL data signal such as voice. A PUCCH signal is transmitted and received in the control region. The control region is also used to transmit UL control information.

The PUCCH includes an RB pair (e.g. m=0, 1, 2 and 3) at both ends of the data region on the frequency axis. The PUCCH includes an RB pair at opposite ends (e.g. a frequency-mirrored RB pair) on the frequency axis and hops over a slot boundary. UCI includes a Hybrid Automatic Repeat reQuest ACKnowledgment/Negative ACKnowledgment (HARQ ACK/NACK), a Channel Quality Indication (CQI), a Precoding Matrix Index (PMI), a Rank Indication (RI), etc.

Figure 13:
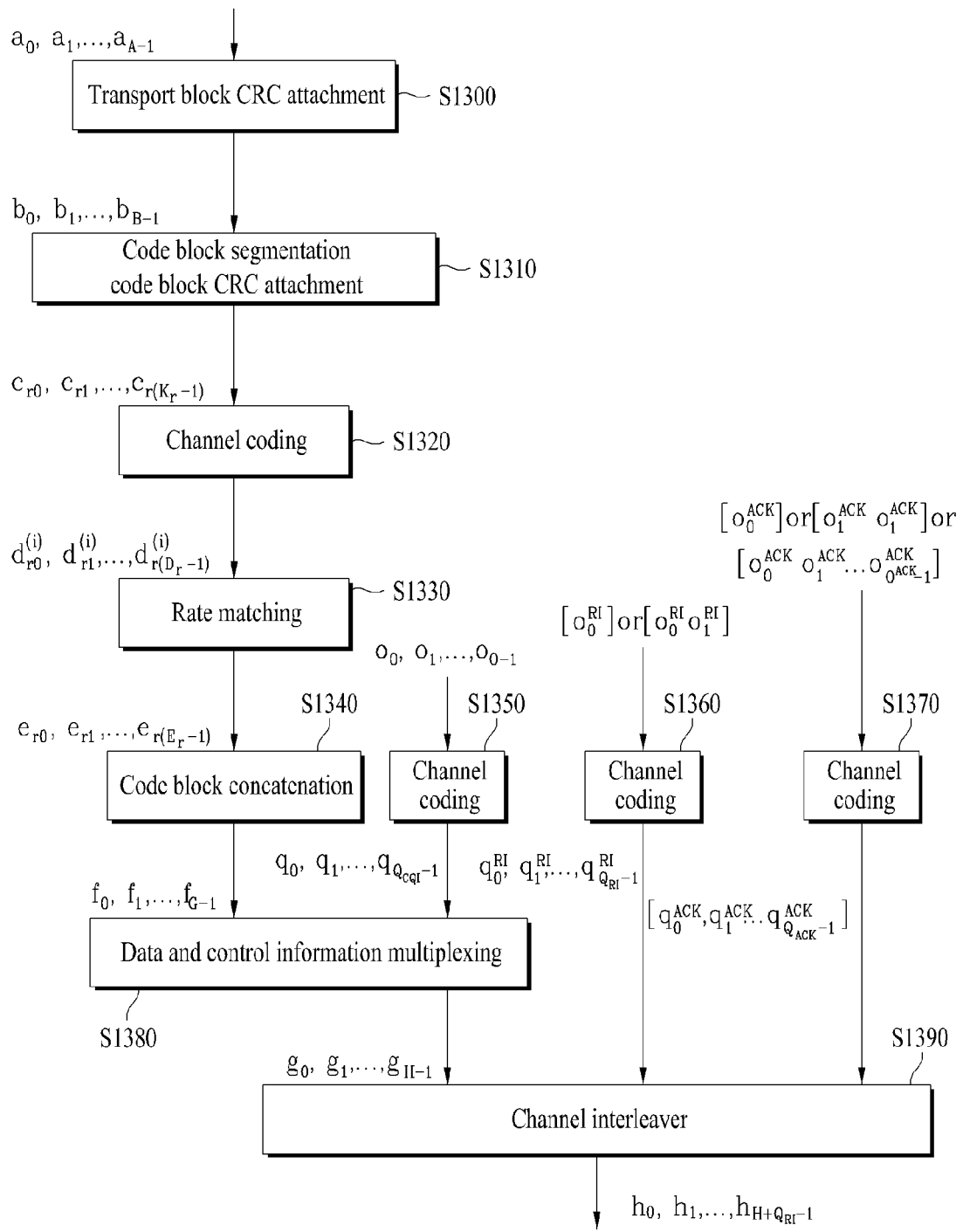
FIG. 13 illustrates an exemplary operation for processing UpLink-Shared Channel (UL-SCH) data and control information that can be used in embodiments of the present invention.

FIG. 13 illustrates an exemplary operation for processing UL-SCH data and control information that can be used in embodiments of the present invention.

Referring to FIG. 13, UL-SCH data is transmitted in one Transport Block (TB) per Transmission Time Interval (TTI) to a coding unit.

Parity bits $p_0, p_1, p_2, p_3, \ldots, p_{L-1}$ are added to TB bits $a_0, a_0, a_1, a_2, a_3, \ldots, a_{A-1}$ received from a higher layer. The size of the TB is A and the number of parity bits, L is 24. Input bits attached with CRC bits as an error detection code may be expressed as $b_0, b_1, b_2, b_3, \ldots, b_{B-1}$ where B is the number of TB bits including the CRC (S1300).

The bits $b_0, b_1, b_2, b_3, \ldots, b_{B-1}$ are segmented into a plurality of Code Blocks (CBs) according to the TB size and each CB is attached with a CRC. The resulting bits are $c_{r0}, c_{r1}, c_{r2}, c_{r3}, \ldots, c_{r(K_r-1)}$ where r is the index of a CB (r=0, ..., C−1), $K_r$ is the number of bits in CB r, and C is the total number of CBs (S1310).

A channel coding unit channel-encodes the bits $c_{r0}, c_{r1}, c_{r2}, c_{r3}, \ldots, c_{r(K_r-1)}$ to $d_{r0}^{(i)}, d_{r1}^{(i)}, d_{r2}^{(i)}, d_{r3}^{(i)}, \ldots, d_{r(D_r-1)}^{(i)}$ where i is the index of a coded data stream (i=0, 1, 2), $D_r$ is the number of bits in an $i^{th}$ coded data stream for CB r (i.e. $D_r \approx K_r+4$), r is the index of a CB (r=0, 1, ..., C−1), $K_r$ is the number of bits in CB r, and C is the total number of CBs. In embodiments of the present invention, each CB may be channel-encoded in Turbo coding (S1320).

After the channel encoding, rate matching is performed. The rate-matched bits are $e_{r0}, e_{r1}, e_{r2}, e_{r3}, \ldots, e_{r(E_r-1)}$ where $E_r$ is the number of rate-matched bits in CB r, r=0, 1, ..., C−1, and C is the total number of CBs (S1330).

CB concatenation follows the rate matching. The CB-concatenated bits are $f_0, f_1, f_2, f_3, \ldots, f_{G-1}$ where G is the total number of coded bits. If control information is are not included in G. $f_0, f_1, f_2, f_3, \ldots, f_{G-1}$ are a UL-SCH codeword (S1340).

Channel quality information (a CQI and/or a PMI), an RI, and an HARQ ACK as UCI are channel-encoded independently (S1350, S1360, and S1370). Each piece of UCI is channel-encoded based on the number of code symbols for the control information. For example, the number of code symbols may be used in rate-matching the coded control information. The number of code symbols corresponds to the number of modulation symbols, the number of REs, etc. in subsequent operations.

An input CQI bit sequence $o_0, o_1, o_2, o_3, \ldots, o_{O-1}$ is channel-encoded to $q_0, q_1, q_2, q_3, \ldots, q_{Q_{CQI}-1}$ (S1350). The CQI is channel-encoded in a different coding scheme according to the number of bits. In addition, if the CQI has 11 or more bits, it is attached with 8 CRC bits. $Q_{CQI}$ is the total number of CQI coded bits. To match the length of the CQI bit sequence to $Q_{CQI}$, the coded CQI bits may be rate-matched. $Q_{CQI}=Q_{CQI}'\times Q_m$ where $Q_{CQI}'$ is the number of CQI code symbols and $Q_m$ is a modulation order for the CQI. $Q_m$ is equal to the modulation order of the UL-SCH data.

An input RI sequence $[o_0^{RI}]$ or $[o_0^{RI} \ o_1^{RI}]$ is channel-encoded (S1360). $[o_0^{RI}]$ and $[o_0^{RI} \ o_1^{RI}]$ are a 1-bit RI and a 2-bit RI, respectively.

The 1-bit RI is subjected to repetition coding. The 2-bit RI is encoded with a (3, 2) simplex code and the RI coded data may be cyclically repeated. An RI having 3 to 11 bits is encoded with a (32, O) RM code used for the UL-SCH. For an RI having 12 or more bits, RI information is divided into two groups and each group is encoded with a (32, O) RM code in a double RM structure. An output RI bit sequence $q_0^{RI}, q_1^{RI}, q_2^{RI}, \ldots, q_{Q_{RI}-1}^{RI}$ is obtained by concatenating an RI CB(s). Herein, $Q_{RI}$ is the total number of RI coded bits. To match the length of the coded RI bit to $Q_m$, the last concatenated RI CB may be a part (i.e. rate matching). $Q_{RI}=Q_{RI}'\times Q_m$ where $Q_{RI}'$ is the number of RI code symbols and $Q_m$ is a modulation order for the RI. $Q_m$ is equal to the modulation order of the UL-SCH data.

An input HARQ-ACK bit sequence $[o_0^{ACK}]$, $[o_0^{ACK} \ o_1^{ACK}]$, or $[o_0^{ACK} \ o_1^{ACK} \ldots o_{O^{ACK}-1}^{ACK}]$ is channel-encoded. $[o_0^{ACK}]$ and $[o_0^{ACK} \ o_1^{ACK}]$ are a 1-bit HARQ-ACK and a 2-bit HARQ-ACK, respectively. $[o_0^{ACK} \ o_1^{ACK} \ldots o_{O^{ACK}-1}^{ACK}]$ is an HARQ-ACK having more than 2 bits (i.e. $O^{ACK}>2$).

An ACK is encoded to 1 and a NACK is encoded to 0. The 1-bit HARQ-ACK is subjected to repetition coding. The 2-bit HARQ-ACK is encoded with a (3, 2) simplex code and then may be cyclically repeated. An HARQ-ACK having 3 to 11 bits is encoded with a (32, O) RM code used for the UL-SCH. For an HARQ-ACK having 12 or more bits, HARQ-ACK information is divided into two groups and each group is encoded with the (32, O) RM code in a double RM structure. $Q_{ACK}$ is the total number of HARQ-ACK coded bits. $q_0^{ACK}, q_1^{ACK}, q_2^{ACK}, \ldots, q_{Q_{ACK}-1}^{ACK}$ is obtained by concatenating an HARQ-ACK CB(s). To match the length of the HARQ-ACK bit sequence to $Q_{ACK}$, the last concatenated HARQ-ACK CB may be a part (i.e. rate matching). $Q_{ACK}=Q_{ACK}'\times Q_m$ where $Q_{ACK}'$ is the number of HARQ-ACK code symbols and $Q_m$ is a modulation order for the HARQ-ACK. $Q_m$ is equal to the modulation order of the UL-SCH data.

A data/control multiplexing block receives the UL-SCH coded bits $f_0, f_1, f_2, f_3, \ldots, f_{G-1}$ and the CQI/PMI coded bits $q_0, q_1, q_2, q_3, \ldots, q_{Q_{CQI}-1}$ (S1380). The data/control multiplexing block outputs bits $g_0, g_1, g_2, g_3, \ldots, g_{H'-1}$ where $g_i$ is a column vector of length $Q_m$ (i=0, ..., H'−1). $g_i$ (i=0, ..., H'−1) is a column vector of length ($Q_m \cdot N_L$). H=(G+$N_L \cdot Q_{CQI}$) and H'=H/($N_L \cdot Q_m$) where $N_L$ is the number of layers to which a UL-SCH TB is mapped, and H is the total number of coded bits allocated for UL-SCH data and CQI/PMI information in the $N_L$ transmission layers to which the TB is mapped. Herein, H is the total number of coded bits allocated to the UL-SCH data and the CQI/PMI.

A channel interleaver channel-interleaves input coded bits. The input of the channel interleaver is the output of the data/control multiplexing block, $g_0, g_1, g_2, g_3, \ldots, g_{H'-1}$, the coded RI $q_0^{RI}, q_1^{RI}, q_2^{RI}, \ldots, q_{Q'_{RI}-1}^{RI}$, and the coded HARQ-ACK $q_0^{ACK}, q_1^{ACK}, q_2^{ACK}, \ldots, q_{Q'_{ACK}-1}^{ACK}$ (S1390).

In step S1390, $g^i$ is the column vector of the CQI/PMI length $Q_m$ and i=0, ..., H'−1 (H'=H/$Q_m$). $q_i^{ACK}$ is the column vector of the ACK/NACK length $Q_m$ and i=0, ..., $Q_{ACK}'$−1 ($Q_{ACK}'=Q_{ACK}/Q_m$). $q_i^{RI}$ is the column vector of the RI length $Q_m$ and i=0, ..., $Q_{RI}'$−1 ($Q_{RI}'=Q_{RI}/Q_m$).

The channel interleaver multiplexes the control information for PUSCH transmission and/or the UL-SCH data. Specifically, the channel interleaver maps the control information and the UL-SCH data to a channel interleaver matrix corresponding to PUSCH resources.

After the channel interleaving, a bit sequence $h_0, h_1, h_2, \ldots, h_{H+Q_{RI}-1}$ is output from the channel interleaver matrix column by column. The interleaved bit sequence is mapped to a resource grid.

Figure 14:
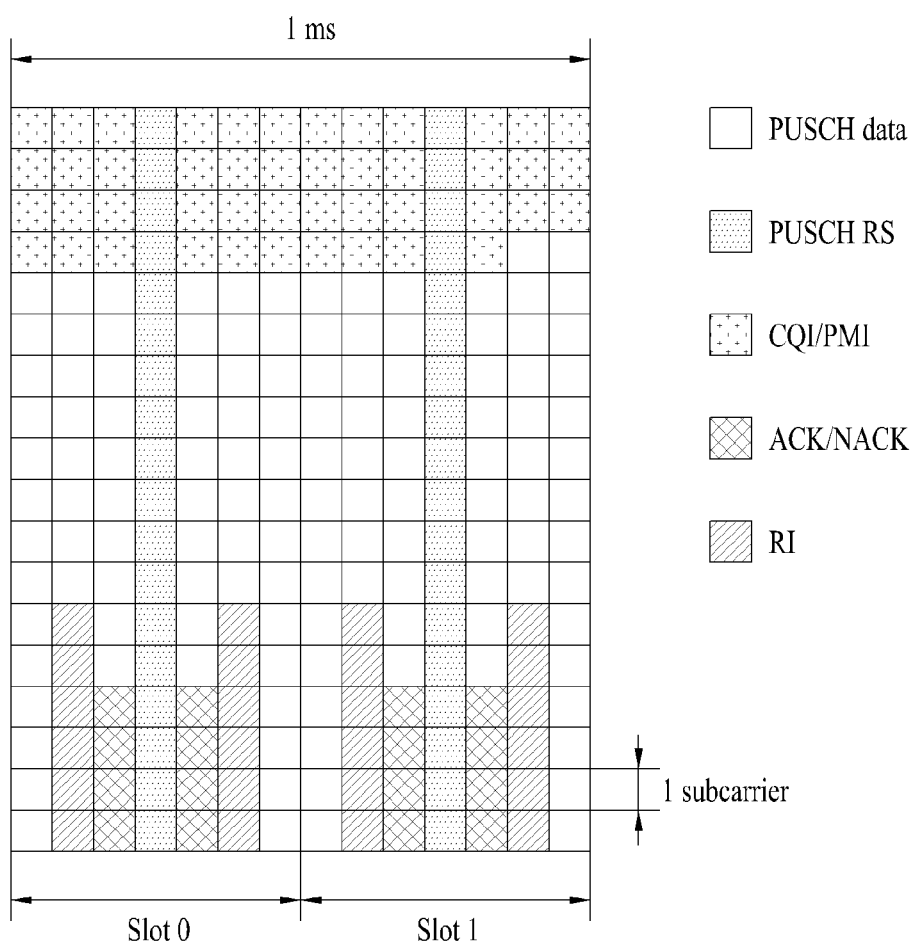
FIG. 14 illustrates an exemplary method for multiplexing UCI and UL-SCH data into a PUSCH.

FIG. 14 illustrates an exemplary method for multiplexing UCI and UL-SCH data into a PUSCH.

When a UE transmits control information in a subframe to which PUSCH transmission is allocated, the UE multiplexes UCI with UL-SCH data before DFT spreading. The UCI includes at least one of a CQI/PMI, an HARQ-ACK/NACK, and an RI.

The number of REs used for transmission of each of the CQI/PMI, the HARQ-ACK/NACK, and the RI is determined based on a Modulation and Coding Scheme (MCS) for PUSCH transmission and an offset value ($\Delta_{offset}^{CQI}$, $\Delta_{offset}^{HARQ-ACK}$, or $\Delta_{offset}^{RI}$). An offset value allows a different coding rate according to control information and is set semi-statically by higher-layer signaling (e.g. Radio Resource Control (RRC) signaling). The UL-SCH data and the control information are mapped to different REs. The control information is mapped to the two slots of a subframe. Because an eNB has prior knowledge of transmission of control information on a PUSCH, it may readily demultiplex control information and a data packet.

Referring to FIG. 14, CQI and/or PMI (CQI/PMI) resources are located at the start of UL-SCH data resources. After a CQI/PMI is mapped sequentially to all SC-FDMA symbols of one subcarrier, it is mapped to another subcarrier. The CQI/PMI is mapped from left to right, that is, in an ascending order of SC-FDMA symbol indexes in a subcarrier. PUSCH data (UL-SCH) data is rate-matched in consideration of the amount of the CQI/PMI resources (i.e. the number of CQI/PMI code symbols). The same modulation order applies to the UL-SCH data and the CQI/PMI.

For example, if the size of CQI/PMI information (the payload size of the CQI/PMI) is small (e.g. 11 or fewer bits), the CQI/PMI information may be encoded with a (32, k) block code, like PUCCH data transmission, and the coded CQI/PMI data may be cyclically repeated. A CRC is not used for a CQI/PMI of a small information size.

If the CQI/PMI information size is large (e.g. more than 11 bits), the CQI/PMI information is attached with an 8-bit CRC, channel-encoded with a trail-biting convolution code, and then rate-matched. An ACK/NACK is inserted into a part of SC-FDMA resources to which the UL-SCH data is mapped by puncturing. The ACK/NACK is adjacent to RSs. In a corresponding SC-FDMA symbol, the ACK/NACK is filled from bottom to top, that is, in an ascending order of subcarrier indexes.

In the case of a normal CP, the ACK/NACK resides in SC-FDMA symbol #2/#4 in each slot, as illustrated in FIG. 14. A coded RI is located in a symbol (i.e. symbol #1/#5) adjacent to the ACK/NACK symbol irrespective of whether the ACK/NACK is actually transmitted in a subframe. The ACK/NACK, the RI, and the CQI/PMI are encoded independently.

Figure 15:
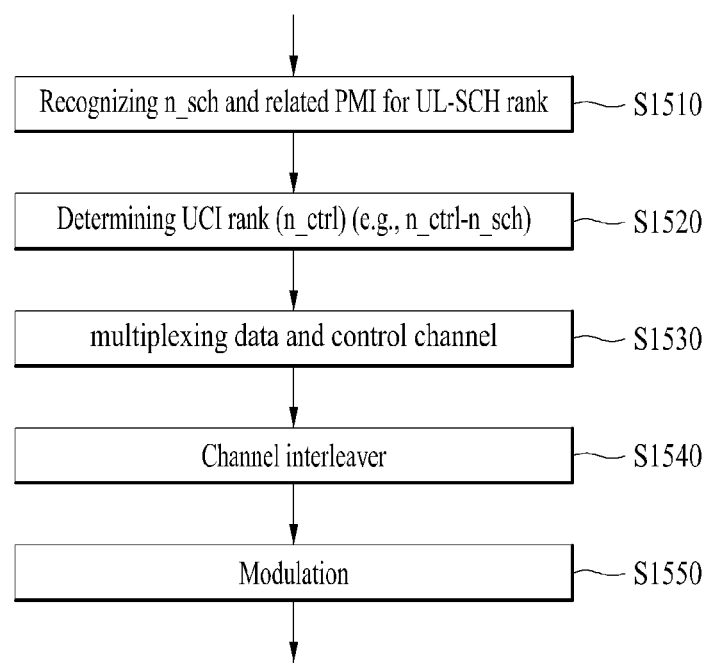
FIG. 15 illustrates multiplexing of control information and UL-SCH data in a Multiple Input Multiple Output (MIMO) system.

FIG. 15 illustrates multiplexing of control information and UL-SCH data in a Multiple Input Multiple Output (MIMO) system.

Referring to FIG. 15, a UE determines a rank (n_sch) and its related PMI for a UL-SCH (a data part) based on scheduling information configured for PUSCH transmission (S1510). In addition, the UE determines a rank (n_ctrl) for UCI (S1520). The rank of the UCI may be, but not limited to, equal to that of the UL-SCH (n_ctrl=n_sch). Subsequently, the data is multiplexed with the control channel (S1530). A channel interleaver performs time-first mapping on data/CQI and maps an ACK/NACK/RI by puncturing REs near to DM-RSs (s1540). The data and the control channel are modulated, referring to an MCS table (S1550). For example, QPSK, 16QAM, or 64QAM is available as a modulation scheme for the data and the control channel. The order/position of a modulation block may be changed (e.g. before multiplexing the data and the control channel).

Figure 16:
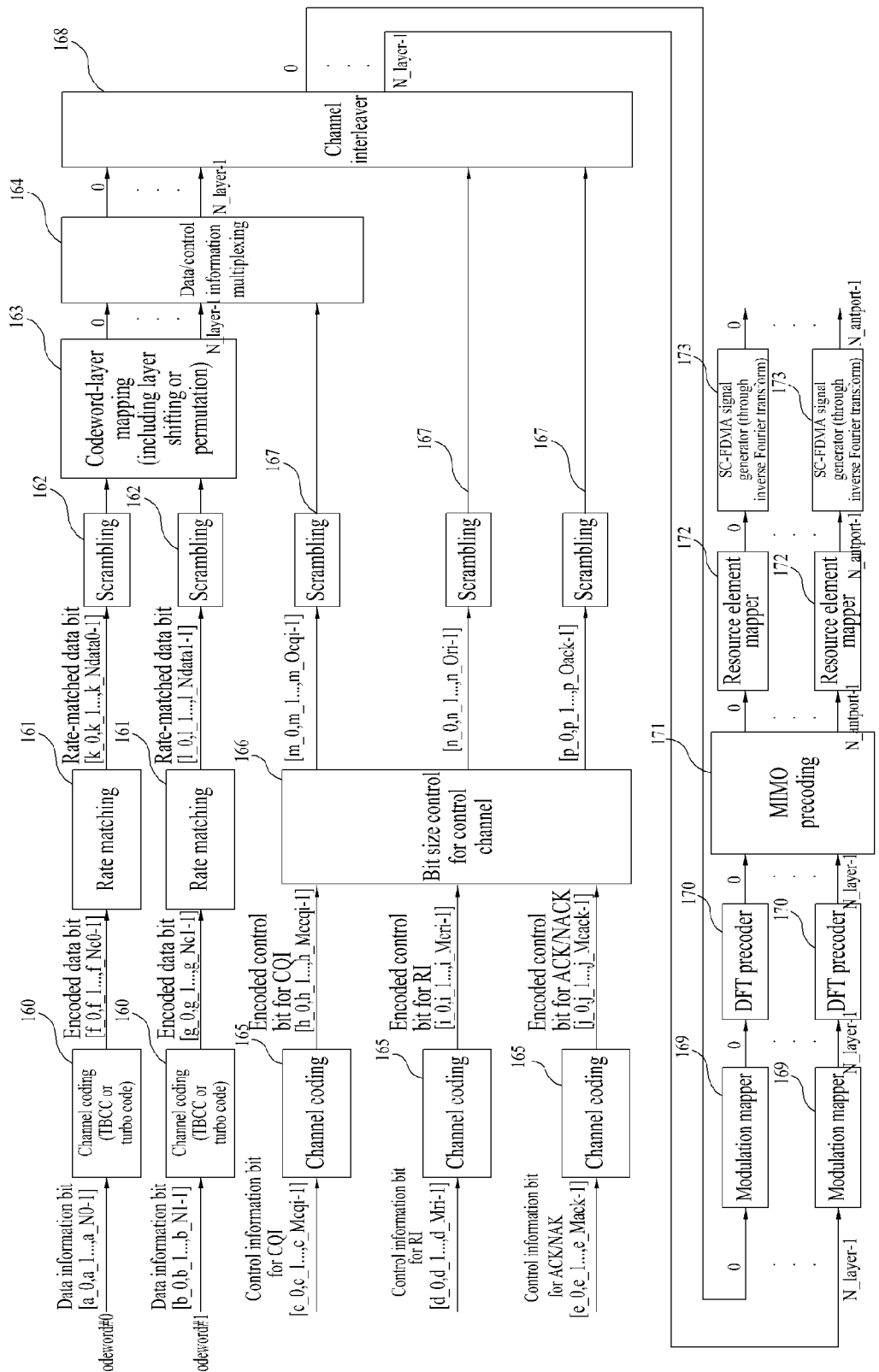
FIGS. 16 and 17 illustrate an exemplary method for multiplexing a plurality of UL-SCH transport blocks with UCI and transmitting the multiplexed signal in a UE according to an embodiment of the present invention.
Figure 17:
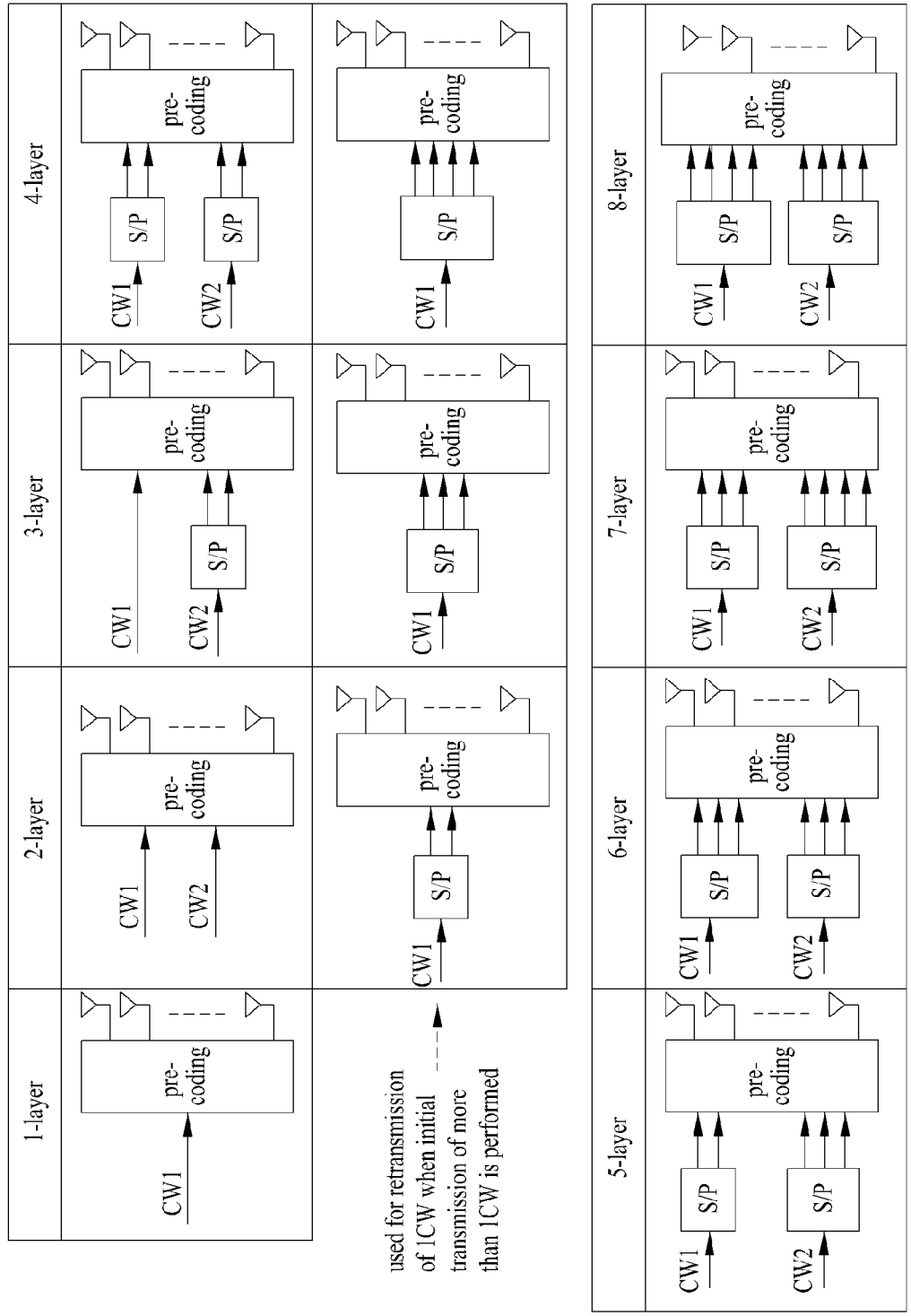

FIGS. 16 and 17 illustrate an exemplary method for multiplexing a plurality of UL-SCH TBs with UCI and transmitting the multiplexed signal in a UE according to an embodiment of the present invention.

For the convenience of description, it is assumed in FIGS. 16 and 17 that two codewords are transmitted. However, FIGS. 16 and 17 may apply to transmission of one codeword or three or more codewords. A codeword and a TB are equivalent and these terms are interchangeably used herein. The basic operation for multiplexing UL-SCH data with control information and transmitting the multiplexed signal is performed in the same manner as or in a similar manner to FIGS. 13 and 14. Therefore, the following description focuses on a MIMO-related part.

In FIG. 16, in the case where two codewords are transmitted, each codeword is channel-encoded (160) and rate-matched according to a given MCS level and resource size (161). The coded bits may be scrambled cell-specifically, UE-specifically, or codeword-specifically (162). Then the codewords are mapped to layers (163). The codeword to layer mapping may involve layer shifting or permutation.

The function block 163 may map codewords to layers in the manner illustrated in FIG. 17. Precoding positions of FIG. 17 may be different from the precoding positions of FIG. 13.

Referring to FIG. 16 again, control information such as a CQI, an RI, and an ACK/NACK is channel-encoded in channel encoders 165 according to a given specification. For the CQI, the RI, and the ACK/NACK, the same channel code may be used in encoding every codeword or a different channel code may be used in encoding each codeword.

The number of the coded bits of the control information may be changed by a bit size controller 166. The bit size controller 166 may be incorporated into the channel encoders 165. A signal output from the bit size controller 166 is scrambled (167). The scrambling may be cell-specific, layer-specific, codeword-specific, or UE-specific.

The bit size controller 166 may operate in the following manner.

(1) The bit size controller recognizes the rank of PUSCH data (n_rank_pusch).

(2) The rank of a control channel (n_rank_control) is set to be equal to that of the data (i.e. n_rank_control=n_rank_pusch) and the number of bits of the control channel (n_bit_ctrl) is increased by multiplying it by the rank of the control channel.

One of methods for performing this operation is to simply repeat the control channel by copying it. The control channel may be at an information level before channel coding or at a coded bit level after channel coding. For example, if a control channel with n_bit_ctrl=4 is [a0, a1, a2, a3] and n_rank_pusch=2, the increased number of bits of the control channel (n_ext_ctrl) may be 8 by extending the control channel to [a0, a1, a2, a3, a0, a1, a2, a3].

In another method, a circular buffer may be used to set the number of extended bits of the control channel n_ext_ctrl to 8.

If the bit size controller 166 is incorporated with the channel encoders 165, the coded bits of the control information may be generated using channel coding and rate matching defined in the legacy system (e.g. LTE Rel-8).

To achieve further randomization of each layer, bit-level interleaving may be performed in addition to the operation of the bit size controller 166. Or modulation symbol-level interleaving equivalent to the bit-level interleaving may be performed.

The CQI/PMI channel and the control information about the two codewords (or control data) may be multiplexed in a data/control multiplexer 164. Then, a channel interleaver 168 maps the ACK/NACK information to REs adjacent to UL DM-RSs in each of the two slots of a subframe, while mapping the CQI/PMI in a time-first mapping scheme.

Subsequently, modulation mappers 169 modulate the respective layers. The modulated data is subjected to DFT precoding in DFT precoders 170 and MIMO precoding in a MIMO precoder 171, and then mapped sequentially to REs in RE mappers 172. SC-FDMA signal generators 173 generate SC-FDMA signals and transmit the generated control signals through antenna ports.

The above-described functional blocks are not limited to the positions illustrated in FIG. 16 and may be changed in position, when needed. For example, the scramblers 162 and 167 may reside after the channel interleaver 168. Further, the codeword to layer mapper 163 may reside after the channel interleaver 168 or the modulation mappers 169.

2. Multi-Carrier Aggregation Environment

Communication environments considered in embodiments of the present invention include a multi-carrier environment. That is, a multi-carrier system or a multi-carrier aggregation system refers to a system that aggregates one or more Component Carriers (CCs) each having a smaller bandwidth than a target bandwidth in order to support a broad band in the present invention.

In the present invention, multi-carrier means carrier aggregation (or carrier combining). Carrier aggregation covers aggregation of non-contiguous carriers as well as aggregation of contiguous carriers. The term carrier aggregation is interchangeably used with carrier combining, bandwidth combining, etc.

The LTE-A system aims to support a bandwidth of up to 100 MHz by use of multi-carriers (i.e. carrier aggregation) configured by aggregating two or more CCs. To guarantee backward compatibility with a legacy IMT system, each of one or more carriers, which has a smaller bandwidth than a target bandwidth, may be limited to a bandwidth used in the legacy system.

For example, the legacy 3GPP LTE system supports bandwidths {1.4, 3, 5, 10, 15, and 20 MHz} and the 3GPP LTE-A system may support a broader bandwidth than 20 MHz using these LTE bandwidths. A multi-carrier system of the present invention may support carrier combining (i.e. carrier aggregation) by defining a new bandwidth irrespective of the bandwidths used in the legacy system.

The LTE-A system adopts the concept of cell to manage radio resources. A cell is defined by combining DL and UL resources, although the UL resources are not a necessity. Accordingly, a cell may be configured with DL resources alone or DL and UL resources. If multiple carriers (i.e. carrier combining or carrier aggregation) are supported, the linkage between the carrier frequency of DL resources (or a DL CC) and the carrier frequency of UL resources (or a UL CC) may be indicated by a System Information Block (SIB).

In the LTE-A system, a Primacy Cell (PCell) and a Secondary Cell (SCell) are defined. A PCell refers to a cell operating in a primary frequency (e.g. a Primary CC (PCC)) and an SCell refers to a cell operating in a secondary frequency (a Secondary CC (SCC)). Only one PCell and one or more SCells may be allocated to a specific UE.

The UE uses the PCell for initial connection establishment or connection reestablishment. The PCell may be a cell indicated during handover. An SCell may be configured after RRC connection establishment and may be used to provide additional radio resources.

A PCell and an SCell may be used as serving cells. If the UE is in RRC_CONNECTED state but carrier aggregation has not been configured or is not supported in the UE, only one serving cell including a PCell exists for the UE. On the other hand, if the UE is in RRC_CONNECTED state and carrier aggregation has been configured for the UE, one or more serving cells may exist for the UE. The total serving cells include a PCell and one or more SCells.

After an initial security activation procedure starts, an E-UTRAN may configure a network including one or more SCells by adding them to a PCell initially configured during connection establishment. In a multi-carrier environment, each of a PCell and an SCell may operate as a CC. That is, carrier aggregation may be regarded as combining a PCell with one or more SCells. Hereinbelow, a PCC may be used interchangeably with a PCell in the same meaning and an SCC may be used interchangeably with an SCell in the same meaning.

3. Method for Transmitting UCI

Embodiments of the present invention relate to a resource allocation method, a channel coding method, a transmission structure, and joint/separate coding methods regarding UCI and precoding indexes $W_1$ and $W_2$, in the case where UCI is piggybacked to data on a PUSCH in a Carrier Aggregation (CA) environment. Embodiments of the present invention may also apply to a MIMO system and a single antenna transmission environment.

3.1 UCI Allocation Positions on PUSCH

Figure 18:
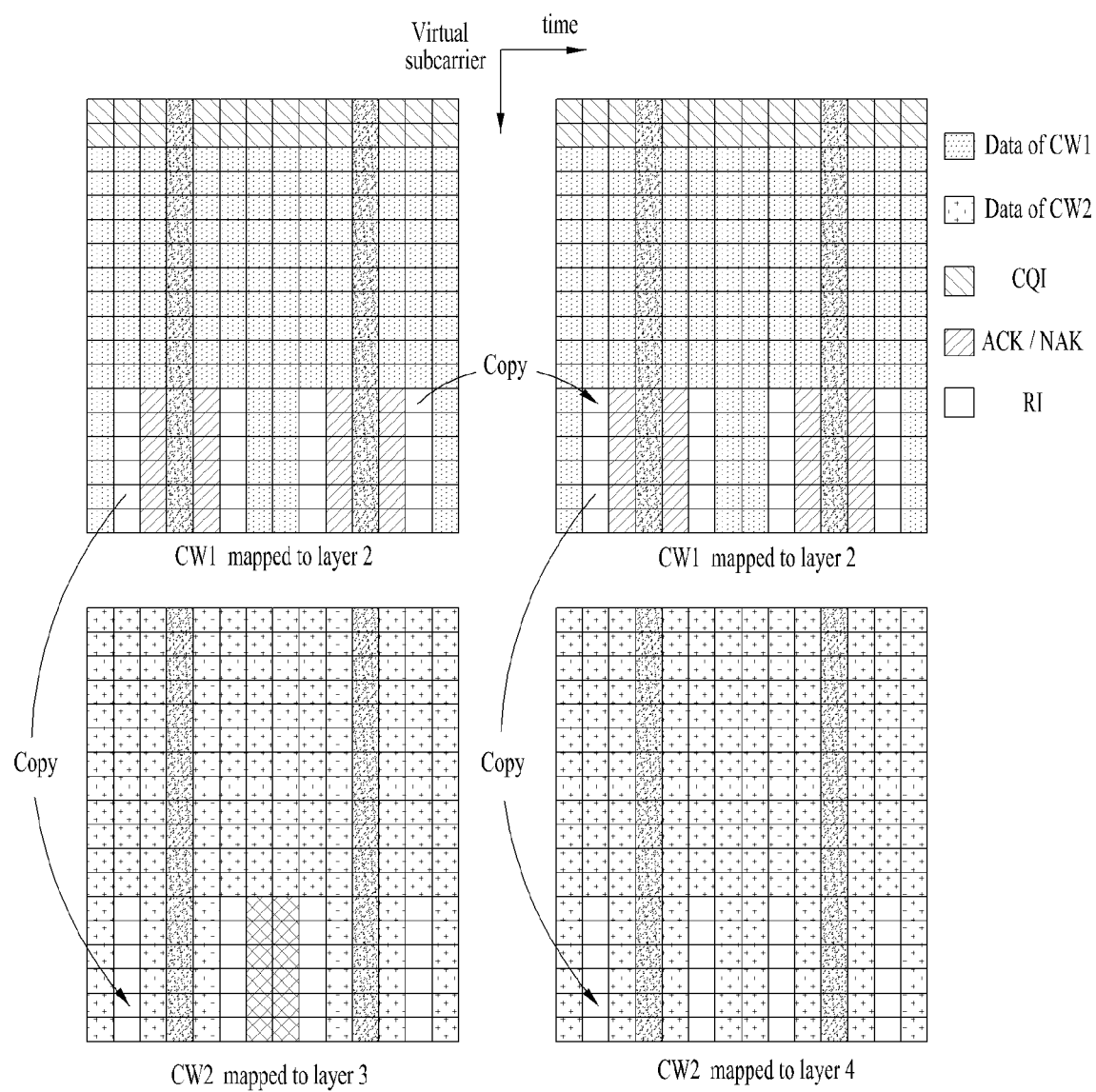
FIG. 18 illustrates one of methods for mapping uplink data and UCI to physical resource elements, for transmission.

FIG. 18 illustrates one of methods for mapping UL data and UCI to physical REs, for transmission.

In FIG. 18, UCI is transmitted for 2 codewords and 4 layers. A CQI is combined with data and mapped, in a time-first mapping scheme, to the remaining REs except REs to which an RI is mapped, using the same modulation order as used for the data and all constellation points. In Single User MIMO (SU-MIMO), the CQI is spread to one codeword. For example, the CQI is transmitted in a codeword having the higher MCS level between two codewords. If the two codewords have the same MCS level, the CQI is transmitted in codeword 0.

An ACK/NACK is allocated to symbols at both sides of RSs by puncturing the combined CQI and data. Since RSs are located in symbol 3 and symbol 10, the ACK/NACK is mapped upward starting from the lowest subcarrier in symbols 2, 4, 9, and 11. The ACK/NACK is mapped in the order of symbols 2, 11, 9 and 4.

An RI is mapped to symbols adjacent to the ACK/NACK. The RI is mapped first of all information transmitted on the PUSCH (the data, the CQI, the ACK/NACK, and the RI). Specifically, the RI is mapped upward starting from the lowest subcarrier in symbols 1, 5, 8, and 12. The RI is mapped in the order of symbols 1, 12, 8 and 5.

Particularly, if each of the ACK/NACK and the RI has 1-bit or 2-bit information, they are mapped in QPSK, using four corners of a constellation. If each of the ACK/NACK and the RI has 3 information bits, they may be mapped using all constellations of the same modulation order as that of the data. In addition, each of the ACK/NACK and the RI carries the same information in the same resources at the same positions in all layers.

3.2 Calculation of Number of Coded Modulation Symbols for CQI and/or PMI–1

In embodiments of the present invention, the number of modulation symbols may be equivalent to the number of code symbols or the number of REs.

Control information or control data is input in the form of a CQI/PMI, an HARQ-ACK, and an RI to channel encoders (e.g. S1350, S1360, and S1370 in FIG. 13 or 165 in FIG. 16). Since a different number of code symbols are allocated to control information, a different coding rate is applied to the control information. If UCI is transmitted on a PUSCH, control information bits $o_0, o_1, o_2, \ldots, o_{O-1}$ of UL Channel State Information (CSI), that is, each of an HARQ-ACK, an RI, and a CQI (or PMI) are channel-encoded independently.

When a UE transmits channel quality control information bits (i.e. a CQI or PMI) on a PUSCH, the number of REs per layer for the CQI or PMI may be calculated by [Equation 1].

$$Q' = \min\left(\left\lceil \frac{(O+L) \cdot M_{sc}^{PUSCH-initial} \cdot N_{symb}^{PUSCH-initial} \cdot \beta_{offset}^{PUSCH}}{\sum_{r=0}^{C^{(x)}-1} K_r^{(x)}} \right\rceil, \right.$$

$$\left. M_{sc}^{PUSCH} \cdot N_{symb}^{PUSCH} - \frac{Q_{RI}}{Q_m} \right)$$

[Equation 1]

In [Equation 1], the number of REs for the CQI or PMI may be expressed as the number Q' of coded modulation symbols. While the following description focuses on the CQI, the same thing applies to the PMI.

In [Equation 1], O is the number of CQI bits and L is the number of CRC bits attached to the CQI bits. If O is 11 or fewer bits, L is 0 and otherwise, L is 8. That is, $$L = \begin{cases} 0 & O \leq 11 \\ 8 & \text{otherwise.} \end{cases}$$

$\beta_{offset}^{CQI}$ is determined according to the number of transmission codewords for TBs. Parameters for determining offset values in consideration of the Signal to Noise Ratio (SNR) difference between data and UCI are determined to be $\beta_{offset}^{PUSCH} = \beta_{offset}^{CQI}$.

$M_{sc}^{PUSCH}$ is a bandwidth allocated (scheduled) for PUSCH transmission in a current subframe for a TB, expressed as the number of subcarriers. $N_{symb}^{PUSCH}$ is the number of SC-FDMA symbols in the current subframe carrying the PUSCH, calculated by [Equation 2].

$N_{symb}^{PUSCH-initial}$ is the number of SC-FDMA symbols per initial PUSCH transmission subframe for the same TB, $M_{sc}^{PUSCH-initial}$ is the number of subcarriers in the corresponding subframe, and x of $K_r^{(x)}$ is the index of a TB having the highest MCS indicated by a UL grant.

$M_{sc}^{PUSCH-initial}$, C and $K_r^{(x)}$ may be acquired from an initial PDCCH for the same TB. If the initial PDCCH (DCI format 0) does not include $M_{sc}^{PUSCH-initial}$, C and $K_r^{(x)}$, the UE may determine the values in a different manner.

For example, when an initial PUSCH for the same TB as transmitted at an initial transmission is scheduled semi-persistently, $M_{sc}^{PUSCH-initial}$, C and $K_r^{(x)}$ may be determined from the latest semi-persistently scheduled PDCCH. Or $M_{sc}^{PUSCH-initial}$, C and $K_r^{(x)}$ may be determined from a random access response grant for the same TB, when the initial PUSCH is indicated by the random access response grant.

The number G of data information bits of the UL-SCH may be calculated by the following equation.

$$G = N_{symb}^{PUSCH} \cdot M_{sc}^{PUSCH} \cdot Q_m - Q_{CQI} - Q_{RI}$$

[Equation 2]

Once the number of REs for the CQI is determined in the above-described manner, the number of channel-coded bits of the CQI may be calculated in consideration of a modulation scheme. $Q_{CQI}$ is the total number of CQI coded bits and $Q_{CQI} = Q_m \cdot Q'$ where $Q_m$ is the number of bits per symbol according to a modulation order, 2 in QPSK, 4 in 16QAM, and 6 in 64QAM. Since RI resources are first allocated, the number of REs allocated to the RI is excluded. If the RI is not transmitted, $Q_{RI}=0$.

3.3 Calculation of Number of Coded Modulation Symbols for HARQ-ACK or RI

Now, a description will be given of methods for calculating the numbers of REs for an ACK/NACK and an RI in a different manner from Clause 3.1.

When a UE transmits HARQ-ACK bits or RI bits in a single cell, the UE should determine the number Q' of coded modulation symbols per layer for the HARQ-ACK or the RI. [Equation 3] is used to calculate the number of modulation symbols, when only one TB is transmitted in a UL cell.

$$Q' = \min\left(\left\lceil \frac{O \cdot M_{sc}^{PUSCH-initial} \cdot N_{symb}^{PUSCH-initial} \cdot \beta_{offset}^{PUSCH}}{\sum_{r=0}^{C-1} K_r} \right\rceil, \right.$$

$$\left. 4 \cdot M_{sc}^{PUSCH} \right)$$

[Equation 3]

In [Equation 3], the number of REs for the ACK/NACK (or the RI) may be expressed as the number Q' of coded modulation symbols. Herein, O is the number of ACK/NACK (or RI) bits.

$\beta_{offset}^{HARQ-ACK}$ and $\beta_{offset}^{RI}$ are determined according to the number of transmission codewords for each TB. Parameters for setting offset values in consideration of the SNR difference between data and UCI are determined to be $\beta_{offset}^{PUSCH} = \beta_{offset}^{HARQ-ACK}$ and $\beta_{offset}^{PUSCH} = \beta_{offset}^{RI}$.

$M_{sc}^{PUSCH}$ is a bandwidth allocated (scheduled) for PUSCH transmission in a current subframe for a TB, expressed as the number of subcarriers. $N_{symb}^{PUSCH-initial}$ is the number of SC-FDMA symbols per initial PUSCH transmission subframe for the same TB and $M_{sc}^{PUSCH-initial}$ is the number of subcarriers per subframe for initial PUSCH transmission. $N_{symb}^{PUSCH-initial}$ may be calculated by [Equation 2].

The number $M_{sc}^{PUSCH-initial}$ of subcarriers for an initial transmission TB, the total number C of CBs derived from a TB, and the size $K_r^{(x)}$, x={0,1} of each CB may be acquired from an initial PDCCH for the same TB.

If these values are not included in the initial PDCCH (DCI format 0 or 4), they may be determined in a different manner. For example, when an initial PUSCH for the same TB is semi-persistently scheduled, $M_{sc}^{PUSCH-initial}$, C, and $K_r^{(x)}$, x={0,1} may be determined from the latest semi-persistently scheduled PDCCH. Or these values may be determined from a random access response grant for the same TB, when the initial PUSCH is indicated by the random access response grant.

When the UE is to transmit two TBs in a UL cell, the UE should determine the number Q' of coded modulation symbols per layer for the HARQ-ACK or the RI. When the initial transmission resource values of the two TBs are different in the UL cell, the number of modulation symbols is calculated by [Equation 4] and [Equation 5].

$$Q' = \max[\min(Q'_{temp}, 4 \cdot M_{sc}^{PUSCH}), Q'_{min}]$$ [Equation 4]

$$Q'_{temp} = \left\lceil \frac{O \cdot M_{sc}^{PUSCH-initial(1)} \cdot N_{symb}^{PUSCH-initial(1)} \cdot}{\sum_{r=0}^{C^{(1)}-1} K_r^{(1)} \cdot M_{sc}^{PUSCH-initial(2)} \cdot N_{symb}^{PUSCH-initial(2)} \cdot \beta_{offset}^{PUSCH}} + \sum_{r=0}^{C^{(2)}-1} K_r^{(2)} \cdot M_{sc}^{PUSCH-initial(1)} \cdot N_{symb}^{PUSCH-initial(1)}} \right\rceil$$ [Equation 5]

In [Equation 4] and [Equation 5], the number of REs for the ACK/NACK (or the RI) may be expressed as the number Q' of coded modulation symbols. O is the number of ACK/NACK (or RI) bits. If O≤2 and $Q_{min}' = \lceil 2O/Q_m' \rceil$, $Q_{min}' = O$ and otherwise, $Q_m' = \min(Q_m^1, Q_m^2) \cdot Q_m^x$, $x=\{1,2\}$ indicating the modulation order of a TB 'x' and $M_{sc}^{PUSCH-inital(x)}$, $x=\{1,2\}$ indicating a scheduled bandwidth expressed as the number of subcarriers for PUSCH transmission in an initial subframe for a first TB and a second TB.

In addition, $N_{symb}^{PUSCH-initial(x)}$, $x=\{1,2\}$ is the number of SC-FDMA symbols per subframe for initial PUSCH transmission of the first and second TBs. $N_{symb}^{PUSCH-initial(x)}$ may be calculated by [Equation 6].

$$N_{symb}^{PUSCH-initial(x)} = (2 \cdot (N_{symb}^{UL} - 1) - N_{SRS}^{(x)}), x=\{1,2\}$$ [Equation 6]

If the UE transmits a PUSCH and an SRS in the same subframe for initial transmission of TB 'x' or PUSCH resource allocation for initial transmission of TB 'x' is partially overlapped with a cell-specific RSR subframe and bandwidth configuration, $N_{SRS}^{(x)}$, $x=\{1,2\}$ is 1 and otherwise, $N_{SRS}^{(x)}$, $x=\{1,2\}$ is 0 in [Equation 6].

In embodiments of the present invention, the UE may acquire $M_{sc}^{PUSCH-initial(x)}$, $x=\{1,2\}$, C, and $K_r^{(x)}$, $x=\{1,2\}$ from an initial PDCCH for a corresponding TB. If the initial PDCCH (DCI format 0 or 4) does not include these values, the values may be determined in a different manner. For example, when an initial PUSCH for the same TB is semi-persistently scheduled, $M_{sc}^{PUSCH-initial(x)}$, $x=\{1,2\}$, C, and $K_r^{(x)}$, $x=\{1,2\}$ may be determined from the latest semi-persistently scheduled PDCCH. Or these values may be determined from a random access response grant for the same TB, when the initial PUSCH is indicated by the random access response grant.

In [Equation 4] and [Equation 5], $\beta_{offset}^{HARQ-ACK}$ and $\beta_{offset}^{RI}$ are determined according to the number of transmission codewords for each TB. Parameters for setting offset values in consideration of the SNR difference between data and UCI are determined to be $\beta_{offset}^{PUSCH} = \beta_{offset}^{HARQ-ACK}$ and $\beta_{offset}^{PUSCH} = \beta_{offset}^{RI}$.

3.4 Channel Coding

A method for channel-encoding UCI according to the number of REs for each UCI value calculated in the above-described methods will be described below.

If an ACK/NACK has one information bit, its input sequence may be represented as $[o_0^{ACK}]$ and channel-encoded according to a modulation order as illustrated in [Table 1]. $Q_m$ is the number of bits per symbols for each modulation order, which is 2, 4 and 6 respectively in QPSK, 16QAM, and 64QAM.

TABLE 1

| $Q_m$ | Encoded HARQ-ACK |
|---|---|
| 2 | $[o_0^{ACK} y]$ |
| 4 | $[o_0^{ACK} y\ x\ x]$ |
| 6 | $[o_0^{ACK} y\ x\ x\ x\ x]$ |

If the ACK/NACK has two information bits, its input sequence may be represented as $[o_0^{ACK}\ o_1^{ACK}]$ and channel-encoded according to a modulation order as illustrated in [Table 2]. $o_0^{ACK}$ is an ACK/NACK bit for codeword 0, $o_1^{ACK}$ is an ACK/NACK bit for codeword 1, and $o_2^{ACK} = (o_0^{ACK} + o_1^{ACK}) \mod 2$. In [Table 1] and [Table 2], x and y are place-holders for scrambling ACK/NACK information so as to maximize the Euclidean distance between modulation symbols carrying the ACK/NACK information.

TABLE 2

| $Q_m$ | Encoded HARQ-ACK |
|---|---|
| 2 | $[o_0^{ACK}\ o_1^{ACK}\ o_2^{ACK}\ o_0^{ACK}\ o_1^{ACK}\ o_2^{ACK}]$ |
| 4 | $[o_0^{ACK}\ o_1^{ACK}\ x\ x\ o_2^{ACK}\ o_0^{ACK}\ x\ x\ o_1^{ACK}\ o_2^{ACK}\ x\ x]$ |
| 6 | $[o_0^{ACK}\ o_1^{ACK}\ x\ x\ x\ x\ o_2^{ACK}\ o_0^{ACK}\ x\ x\ x\ x\ o_1^{ACK}\ o_2^{ACK}\ x\ x\ x\ x]$ |

In multiplexing an ACK/NACK in Frequency Division Duplexing (FDD) or Time Division Duplexing (TDD), if the ACK/NACK is one or two bits, a bit sequence $q_0^{ACK}, q_1^{ACK}, q_2^{ACK}, \ldots, q_{Q_{ACK}-1}^{ACK}$ is generated by concatenating multiple ACK/NACK CBs. In ACK/NACK bundling in TDD, a bit sequence $\tilde{q}_0^{ACK}, \tilde{q}_1^{ACK}, \tilde{q}_2^{ACK}, \ldots, \tilde{q}_{Q_{ACK}-1}^{ACK}$ is also generated by concatenating multiple ACK/NACK CBs. $Q_{ACK}$ is the total number of coded bits of all ACK/NACK CBs. The last concatenated ACK/NACK CB may be configured partially such that the total length of the bit sequence is equal to $Q_{ACK}$.

A scrambling sequence $[w_0^{ACK} w_1^{ACK} w_2^{ACK} w_3^{ACK}]$ may be selected from the following [Table 3] and the index i of the scrambling sequence may be determined by [Equation 7].

$$i = (N_{bundled} - 1) \mod 4$$ [Equation 7]

TABLE 3

| i | $[w_0^{ACK} w_1^{ACK} w_2^{ACK} w_3^{ACK}]$ |
|---|---|
| 0 | [1 1 1 1] |
| 1 | [1 0 1 0] |
| 2 | [1 1 0 0] |
| 3 | [1 0 0 1] |

[Table 3] is a scrambling sequence table for TDD ACK/NACK bundling.

If the ACK/NACK is one bit, m=1 and if the ACK/NACK is two bits, m=3, to thereby generate the bit sequence $q_0^{ACK}$, $q_1^{ACK}, q_2^{ACK}, \ldots, q_{Q_{ACK}-1}^{ACK}$. The bit sequence $q_0^{ACK}, q_1^{ACK}, q_2^{ACK}, \ldots, q_{Q_{ACK}-1}^{ACK}$ is generated by the algorithm expressed as [Table 4].

TABLE 4

```
Set i,k to 0
while i < Q_ACK
    if q̃_i^ACK = y  // place-holder repetition bit
        q_i^ACK = (q̃_{i-1}^ACK + w_{⌊k/m⌋}^ACK) mod 2
        k = (k + 1) mod 4m
    else
        if q̃_i^ACK = x  // a place-holder bit
            q_i^ACK = q̃_i^ACK
```

TABLE 4-continued

```
    else // coded bit
        q_i^ACK = (q̃_i^ACK + w_{⌊k/m⌋}^ACK)mod2
        k = (k + 1)mod4m
    end if
    i = i + 1
end while
```

If the HARQ-ACK has more than 2 information bits (i.e. $[o_0^{ACK}, o_1^{ACK}, \ldots, o_{Q_{ACK}-1}^{ACK}]$ and $O^{ACK}>2$), the bit sequence $q_0^{ACK}, q_1^{ACK}, q_2^{ACK}, \ldots, q_{Q_{ACK}-1}^{ACK}$ may be obtained by [Equation 8].

$$q_i^{ACK} = \sum_{n=0}^{O^{ACK}-1}(O_n^{ACK} \cdot M_{(i\bmod 32),n})\bmod 2 \quad \text{[Equation 8]}$$

In [Equation 8], $i=0, 1, 2, \ldots, Q_{ACK}-1$ and a base sequence $M_{i,n}$ may be given as [Table 5].

TABLE 5

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 0 | 0 | 1 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

When HARQ-ACK/RI information having two or more bits are transmitted on a PUSCH, the HARQ-ACK/RI information may be encoded with an RM code illustrated in [Table 5]. A channel-coded vector sequence of the HARQ-ACK information may be represented as $\underline{q}_0^{ACK}, \underline{q}_1^{ACK}, \ldots, \underline{q}_{Q'_{ACK}-1}^{ACK}$ where $Q'_{ACK}=Q_{ACK}/Q_m$.

The bit sequence $\underline{q}_0^{ACK}, \underline{q}_1^{ACK}, \ldots, \underline{q}_{Q'_{ACK}-1}^{ACK}$ is generated by the algorithm of [Table 6].

TABLE 6

```
Set i,k to 0
while i < Q_ACK
    q_k^ACK = [q_i^ACK ... q_{i+Q_m-1}^ACK]^T
```

TABLE 6-continued

```
    i = i + Q_m
    k = k + 1
end while
```

If the RI has one information bit, its input sequence may be represented as $[o_0^{RI}]$ and channel-encoded according to a modulation order as illustrated in [Table 7].

TABLE 7

| $Q_m$ | Encoded RI |
|---|---|
| 2 | $[o_0^{RI}\ y]$ |
| 4 | $[o_0^{RI}\ y\ x\ x]$ |
| 6 | $[o_0^{RI}\ y\ x\ x\ x\ x]$ |

$Q_m$ is the number of bits per symbols for a modulation order, which is 2, 4 and 6, respectively in QPSK, 16QAM, and 64QAM. An RI is mapped to $[o_0^{RI}]$ as illustrated in [Table 8].

TABLE 8

| $o_0^{RI}$ | RI |
|---|---|
| 0 | 1 |
| 1 | 2 |

If the RI has two information bits, its input sequence may be represented as $[o_0^{RI}\ o_1^{RI}]$ and channel-encoded according to a modulation order as illustrated in [Table 9]. $o_0^{RI}$ is the Most Significant Bit (MSB) of the 2-bit input, $o_1^{RI}$ is the Least Significant Bit (LSB) of the 2-bit input, and $o_2^{RI}=(o_0^{RI}+o_1^{RI})\bmod 2$.

TABLE 9

| $Q_m$ | Encoded RI |
|---|---|
| 2 | $[o_0^{RI}\ o_1^{RI}\ o_2^{RI}\ o_0^{RI}\ o_1^{RI}\ o_2^{RI}]$ |
| 4 | $[o_0^{RI}\ o_1^{RI}\ x\ x\ o_2^{RI}\ o_0^{RI}\ x\ x\ o_1^{RI}\ o_2^{RI}\ x\ x]$ |
| 6 | $[o_0^{RI}\ o_1^{RI}\ x\ x\ x\ x\ o_2^{RI}\ o_0^{RI}\ x\ x\ x\ x\ o_1^{RI}\ o_2^{RI}\ x\ x\ x\ x]$ |

[Table 10] below illustrates an exemplary mapping relationship between $[o_0^{RI}\ o_1^{RI}]$ and the RI.

TABLE 10

| $o_0^{RI}$ | RI |
|---|---|
| 0 | 1 |
| 1 | 2 |

In [Table 7] and [Table 9], x and y are placeholders for scrambling RI information so as to maximize the Euclidean distance between modulation symbols carrying the RI information.

A bit sequence $q_0^{RI}, q_1^{RI}, q_2^{RI}, \ldots, q_{Q_{RI}-1}^{RI}$ is generated by concatenating multiplexed RI CBs. $Q_{RI}$ is the total number of coded bits of all RI CBs. The last concatenated RI CB may be configured partially such that the total length of the bit sequence is equal to $Q_{RI}$.

A channel-coded vector sequence of the RI is represented as $\underline{q}_0^{RI}, \underline{q}_1^{RI}, \ldots, \underline{q}_{Q'_{RI}-1}^{RI}$ where $Q'_{RI}=Q_{RI}/Q_m$. The vector sentience may be obtained by the algorithm of [Table 11].

TABLE 11

Set i,k to 0
while i < $Q_{RI}$
$\underline{q}_k^{RI} = [q_i^{RI} \ldots q_{i+Q_m-1}^{RI}]^T$
i = i + $Q_m$
k = k + 1
end while If the RI (or the ACK/NACK) has 3 to 11 information bits, the RI is channel-encoded to a 32-bit sequence by the aforedescribed RM coding. The RM-coded RI (or ACK/NACK) block $b_0, b_1, b_2, b_3, \ldots, b_{B-1}$ is calculated by [Equation 9], where i=0, 1, 2, . . . . , B-1 and B=32.

$$b_i = \sum_{n=0}^{O-1}(o_n \cdot M_{i,n}) \bmod 2 \quad \text{[Equation 9]}$$

In [Equation 14], i=0, 1, 2, . . . . , $Q_{RI}$−1 and a base sequence $M_{i,n}$ may be given as illustrated in [Table 5]. That is, the RI information bits may be encoded with an RM code illustrated in [Table 5] and transmitted on a PUSCH.

3.5 Rate Matching

To map the UCI encoded to B bits by [Equation 9] to Q' REs, the coded UCI may be rate-matched by [Equation 10].

$$q_i = b_{i\ \bmod\ g},\ i=0,1,\ldots,Q_m \times Q'-1 \quad \text{[Equation 10]}$$

In [Equation 10], $Q_m$ is the number of bits per modulation symbol, 2, 4 and 6 respectively in QPSK, 16QAM, and 64QAM. The channel coding procedure of Clause 3.4 may be used for or may be replaced with channel coding of UCI (a CQI, a HARQ-ACK, and an RI) in FIG. 13 (e.g. steps S1350, S1360, and S1370). The following channel coding procedures according to embodiments of the present invention may be applied to or replaced with the channel coding of FIG. 13.

4. Transmission of UCI and Precoding Codebook Information on PUCCH

Precoding codebooks, their indexes, and UCI may be transmitted on a PUCCH as follows.

4.1

For 2Tx and 4Tx, $W_1$ is an identity matrix, thus requiring no reporting, and an LTE codebook (hereinbelow, referred to as a Rel-8 codebook) may be reused for $W_2$.

4.2

An Rel-8 UE-specific codebook subset may also be supported in the LTE-A system (hereinbelow, referred to as a Rel-10 system).

4.3

If $W_1$ and an RI are transmitted in the same subframe of Rel-8 PUCCH format 1-1 (or PUCCH format 1a), the following extension is possible in Rel-10.

4.3.1

A precoding codebook W may be sub-sampled according to a final codebook design.

4.3.2

The precoding codebook W is determined by two subframes in which the last RI has been reported.

4.3.3

The precoding codebook W may be reported in the following two methods.

Firstly, $W_1$ and the RI are jointly encoded.

Secondly, a wideband CQI and a wideband codebook $W_2$ are transmitted together. If the size of the codebook $W_2$ is 1, $W_2$ is not reported.

4.4

Rel-8 PUCCH format 2-1 (or PUCCH format 2a) may be extended in Rel-10 as follows.

4.4.1

When PUCCH format 2-1 is used in Rel-10, three types of reporting formats are available as follows.

Report format 1 includes an RI and a 1-bit Precoder Type Indication (PRI).

In report format 2, if the PTI is 0, the UE reports the precoder matrix $W_1$ and if the PTI is 1, the UE reports a wideband CQI and the wideband precoder matrix $W_2$.

A method for transmitting a subband selection indicator for predetermined cycling will be described later.

4.4.3

The UE assumes that the PRI is 1 for 2Tx and 4Tx and thus does not report.

4.5

Rel-8 PUCCH mode 1-1 may be extended to the following in Rel-10, for W determined based on an RI reported in the previous subframe.

Subsets of codebook C1 and subsets of codebook C2 are used for each rank such that the total size of a CQI, $W_1$, and $W_2$ does not exceed 11 bits at maximum.

In this case, the subsets of codebook C1 and the subsets of codebook C2 are preferably fixed for each rank. In addition, the subsets of codebook C1 and the subsets of codebook C2 may be designed jointly or separately for each rank.

For example, an available co-phase subset may be different for a different beam angle.

4.6

Rel-10 may support a natural extension of aperiodic Rel-8 PUSCH CQI mode as illustrated in [Table 12].

TABLE 12

| CQI/PMI mode | CQI | W1 | W2 |
|---|---|---|---|
| 1-2 | Wideband CQI for total system bandwidth | Single W1: single W1 for total system bandwidth | Subband PMI W2 |
| 2-2 | Wideband CQI for total system bandwidth and "M-preferred" CQI (UE-selected band) | | Wideband PMI W2 + "M-preferred" PMI W2 (UE-selected subband) |
| 3-1 | Subband CQI | | Wideband PMI W2 |

4.6.1

It may be determined later whether to support PUSCH mode 3-2 that simultaneously supports a subband PMI and a subband CQI for the purpose of increasing feedback accuracy for MU/SU in Rel-10.

4.6.2

Aperiodic CSI reporting may be initiated as follows.

To dynamically indicate cells for CSI feedback, a UE-specific search space trigger activated by an eNB may be based on a 2-bit code point of a PDCCH. The following RRC signaling may be used to configure a cell set.

| PDCCH code point | Description |
|---|---|
| 00 | Aperiodic CSI reporting is not triggered |
| 01 | Aperiodic CSI reporting is triggered for serving cell |
| 11 | Aperiodic CSI reporting is triggered for a first set of serving cells configured by higher layer |
| 10 | Aperiodic CSI reporting is triggered for a second set of serving cells configured by higher layer |

The common search space may be triggered by a 1-bit code point of a PDCCH. If the 1-bit code point of the PDCCH is set to '1', this implies a trigger for a DL CC of the same serving cell SIB2-linked to a UC CC carrying CSI.

4.7

W1 and W2 may be reported independently on a PUSCH transmitted in the same subframe.

4.8

For 2Tx and 4Tx, the UE may not report $W_1$.

5. Method for Applying CRC to UCI

Methods for applying a CRC to UCI according to embodiments of the present invention will be described below.

Figure 19:
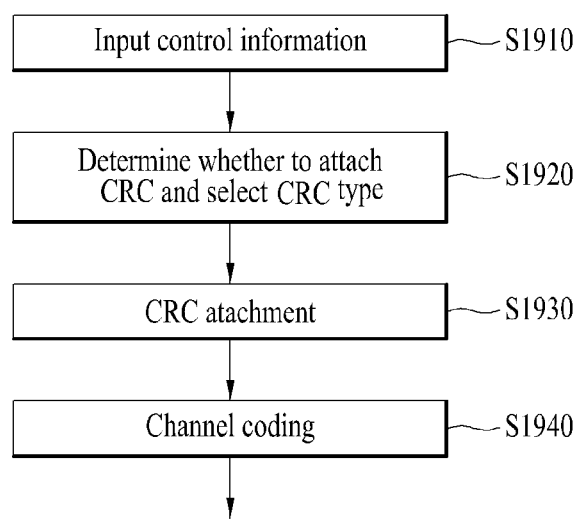
FIG. 19 illustrates an operation for determining whether to add a Cyclic Redundancy Check (CRC) and what CRC to be used based on control information according to an embodiment of the present invention.

FIG. 19 illustrates an operation for determining whether to attach a CRC and what CRC to be used according to control information according to an embodiment of the present invention.

While embodiments of the present invention will be described in the context of UCI being a CQI/PMI, by way of example, they are also applicable to HARQ-ACK information and RI information. Referring to FIG. 19, a UE determines whether there is UCI to be transmitted (S1910).

Upon receipt of CQI/PMI information to be transmitted, the UE may determine whether to add a CRC to the CQI/PMI information and what type of CRC to be applied to the CQI/PMI information (S1920).

For example, the UE may determine whether to attach a CRC to the CQI/PMI information and what type of CRC to be applied to the CQI/PMI information according to the number of CCs in a cell to which the UE belongs, the bit size of the UCI, the size of a CRC to be attached, and/or a coding scheme.

Once the UE determines to apply a CRC and the type of a CRC to be used in step S1920, the UE adds the determined CRC to the CQI/PMI information bits (S1930).

The UE may channel-encode the CRC-attached CQI/PMI information bits. The channel coding may be pursuant to the channel coding procedure of step S1350 of FIG. 13, S165 of FIG. 16, and/or Clause 3.4 (S1940).

The UE may multiplex the coded CQI/PMI information bits with data and transmit the multiplexed signal or only the CQI/PMI information bits on a PUSCH. Herein, the UE may interleave the coded bits in a channel interleaver, modulate the interleaved bits, map the modulation symbols to radio resources, and then transmit the resulting signal to the eNB.

Steps S1940 and a subsequent procedure in FIG. 19 may be performed pursuant to steps S1350 to S1390 of FIG. 13 and steps 164 to 173 of FIG. 16.

Figure 20:
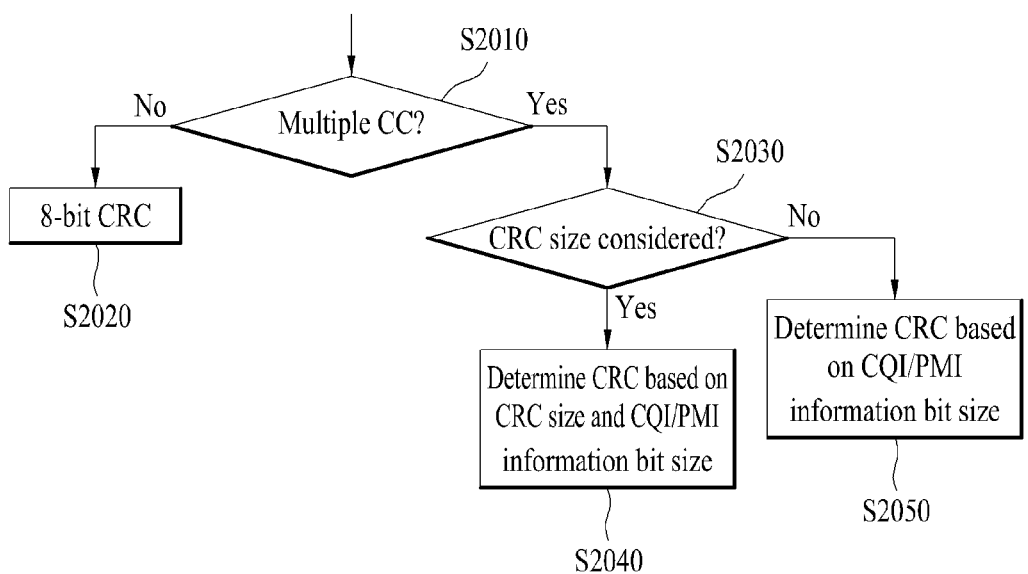
FIG. 20 illustrates an exemplary operation of step S1920 illustrated in FIG. 19 according to an embodiment of the present invention.

FIG. 20 illustrates an exemplary operation of step S1920 illustrated in FIG. 19 according to an embodiment of the present invention.

Now a detailed description will be given of a method for determining whether to attach a CRC to a CQI/PMI among UCI and adding the CRC to the CQI/PMI. Referring to FIG. 20, the UE selects a CRC type by determining whether the eNB supports multiple CCs or a single CC (S2010).

If the eNB to which the UE belongs supports a single CC in step S2010, the UE may determine to use an 8-bit CRC for the control information. That is, in the case of a single CC, the UE may use an 8-bit CRC as in Rel-8 (S2020).

If the cell to which the UE belongs supports multiple CCs (i.e. two or more CCs) in step S2010, the UE may select a CRC type in consideration of a CRC size (S2030).

If a CRC size is considered in step S2030, the UE may determine a CRC, taking into account the sum of the CRC size and the bit size of the CQI/PMI information (S2040).

If the CRC size is not considered in step S2030, the UE may select a CRC type based on the bit size of the CQI/PMI information (S2050).

In FIG. 20, step S2010 is not a requisite. That is, the UE may determine whether to add a CRC, considering only step S2030 with no regard to step S2010. While the method for determining whether to add a CRC and selecting a CRC in a UE is illustrated in FIG. 20, the eNB may determine whether to add a CRC and select a CRC and then may indicate the CRC to the UE by DL control information or UL signaling. Hereinbelow, steps S2040 and S2050 will be described in detail.

5.1 Method for Determining CRC According to CRC Size and CQI/PMI Size

The method for determining a CRC in step S2040 will be described in greater detail.

In the case of multiple CCs, the UE and/or the eNB may determine a CRC according to the total bit size of a CRC and CQI/PMI information.

5.1.1

If the sum of the CRC size and the bit size of the CQI/PMI information is equal to or less than 64, an 8-bit CRC may be applied and otherwise, a 24-bit CRC may be applied.

For example, if the CQI/PMI bit size is equal to or less than 56, an 8-bit CRC may be applied and otherwise, a 24-bit CRC may be applied. The 24-bit CRC may be a CB CRC $g_{CRC24A}(D)=[D^{24}+D^{23}+D^{18}+D^{17}+D^{14}+D^{11}+D^{10}+D^7+D^6+D^5+D^4+D^3+D+1]$ or TB CRC $g_{CRC24B}(D)=[D^{24}+D^{23}+D^6+D^5+D+1]$.

5.1.2

If the sum of the CRC size and the bit size of the CQI/PMI information is equal to or less than 128, an 8-bit CRC may be applied and otherwise, a 24-bit CRC may be applied.

For example, if the CQI/PMI bit size is equal to or less than 120, an 8-bit CRC may be applied and otherwise, a 24-bit CRC may be applied. The 24-bit CRC may be a CB CRC $g_{CRC24A}(D)=[D^{24}+D^{23}+D^{18}+D^{17}+D^{14}+D^{11}+D^{10}+D^7+D^6+D^5+D^4+D^3+D+1]$ or a TB CRC $g_{CRC24B}(D)=[D^{24}+D^{23}+D^6+D^5+D+1]$.

5.1.3

If the sum of the CRC size and the bit size of the CQI/PMI information is equal to or less than 64, an 8-bit CRC may be applied and otherwise, a 16-bit CRC may be applied. The 16-bit CRC may be $g_{CRC16}(D)=[D^{16}+D^{12}+D^5+1]$.

5.1.4

If the sum of the CRC size and the bit size of the CQI/PMI information is equal to or less than 128, an 8-bit CRC may be applied and otherwise, a 16-bit CRC may be applied. For example, if the CQI/PMI bit size is equal to or less than 120, an 8-bit CRC may be applied and otherwise, a 16-bit CRC may be applied. The 16-bit CRC may be $g_{CRC16}(D)=[D^{16}+D^{12}+D^5+1]$.

5.2 Method for Determining CRC According to CQI/PMI Size Only

The method for determining a CRC size in step S2050 will be described in greater detail. In the case of multiple CCs, the UE and/or the eNB may determine a CRC size according to the total bit size of CQI/PMI information.

5.2.1

If the bit size of the CQI/PMI except for the CRC is equal to or larger than 40, a 24-bit CRC may be applied.

For example, the 24-bit CRC added to the CI/PMI may be a CB CRC $g_{CRC24A}(D)=[D^{24}+D^{23}+D^{18}+D^{17}+D^{14}+D^{11}+D^{10}+D^7+D^6+D^5+D^4+D^3+D+1]$ or a TB CRC $g_{CRC24B}(D)=[D^{24}+D^{23}+D^6+D^5+D+1]$.

5.2.2

If the bit size of the CQI/PMI except for the CRC is equal to or larger than 40, a 16-bit CRC may be applied.

The 16-bit CRC may be $g_{CRC16}(D)=[D^{16}+D^{12}+D^5+1]$.

5.2 Determination of CRC Size According to CCs

The method for determining a CRC according to the number of CCs (i.e. cells) supported by an eNB irrespective of the bit size of CQI/PMI information in step S1920 will be described in greater detail.

5.3.1. 2 or More CCs

The UE may apply a 24-bit CRC to a CQI/PMI irrespective of the bit size of CQI/PMI information. The 24-bit CRC may be a CB CRC $g_{CRC24A}(D)=[D^{24}+D^{23}+D^{18}+D^{17}+D^{14}+D^{11}+D^{20}+D^7+D^6+D^5+D^4+D^3+D+1]$ or a TB CRC $g_{CRC24B}(D)=[D^{24}+D^{23}+D^6+D^5+D+1]$.

Or the UE may apply a 16-bit CRC to the CQI/PMI irrespective of the bit size of CQI/PMI information. The 16-bit CRC may be $g_{CRC16}(D)=[D^{16}+D^{12}+D^5+1]$.

5.3.2. 3 or More CCs

The UE may apply a 24-bit CRC to the CQI/PMI irrespective of the bit size of CQI/PMI information. The 24-bit CRC may be a CB CRC $g_{CRC24A}(D)=[D^{24}+D^{23}+D^{18}+D^{17}+D^{14}+D^{11}+D^{10}+D^7+D^6+D^5+D^4+D^3+D+1]$ or a TB CRC $g_{CRC24B}(D)=[D^{24}+D^{23}+D^6+D^5+D+1]$.

Or the UE may apply a 16-bit CRC to the CQI/PMI irrespective of the bit size of CQI/PMI information. The 16-bit CRC may be $g_{CRC16}(D)=[D^{16}+D^{12}+D^5+1]$.

5.3.3. 4 or More CCs

The UE and/or the eNB may determine to apply a 16-bit CRC $g_{CRC16}(D)=[D^{16}+D^{12}+D^6+1]$ for 2 or 3 CCs and a 24-bit CRC for 4 or more CCs. The 24-bit CRC may be a CB CRC $g_{CRC24A}(D)=[D^{24}+D^{23}+D^{18}+D^{17}+D^{14}+D^{11}+D^{10}+D^7+D^6+D^5+D^4+D^3+D+1]$ or a TB CRC $g_{CRC24B}(D)=[D^{24}+D^{23}+D^6+D^5+D+1]$.

5.4 Determination of CRC Size According to Channel Coding Scheme

The UE and/or the eNB may determine a CRC type for a CQI/PMI according to a channel coding scheme in the case of multiple CCs (i.e. 2 or more CCs) in step S1920.

For example, when an RM code is used in channel coding of the CQI/PMI, the UE may not use a CRC.

If a TBCC is used in channel coding of the CQI/PMI, the UE may use one of an 8-bit CRC, a 16-bit CRC, and a 24-bit CRC irrespective of the size of the CQI/PMI.

If a Turbo code is used in channel coding of the CQI/PMI, the UE may use one of a 16-bit CRC and a 24-bit CRC.

As the CQI/PMI size increases, it may be more difficult to guarantee error detection with an 8-bit CRC. That is, error detection performance can be increased by use of a CRC having more than 8 bits according to the size of the CQI/PMI information. For example, the use of a 16-bit CRC and a 24-bit CRC guarantees reliable error detection performance for increased CQI/PMI information bits in a CA environment in embodiments of the present invention. Particularly, despite an increased data size, the 24-bit CRC leads to more reliable transmission of control information than the 16-bit CRC.

6. Apparatuses

Figure 21:
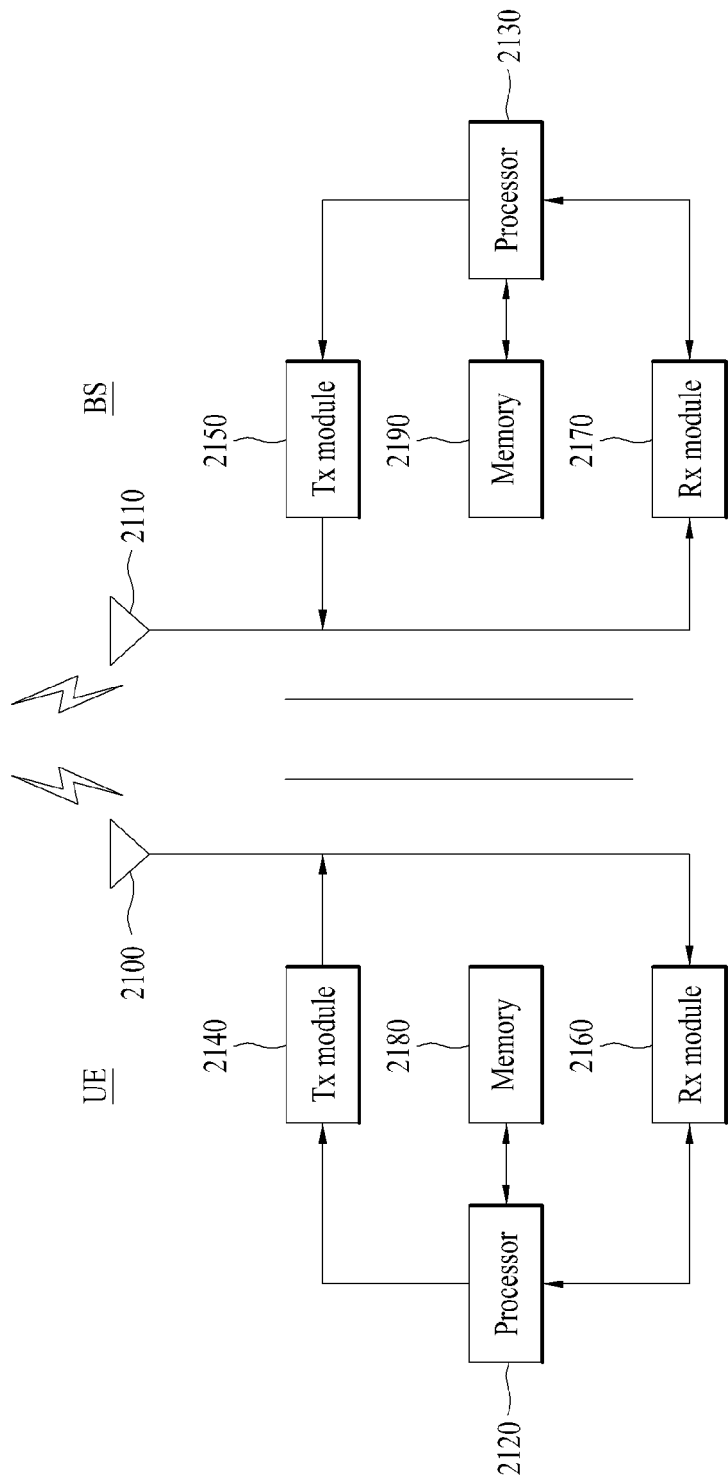
FIG. 21 is a block diagram of apparatuses that can implement the methods illustrated in FIGS. 1 to 20.

Apparatuses illustrated in FIG. 21 are means that can implement the methods described before with reference to FIGS. 1 to 20.

A UE may act as a transmitter on uplink and as a receiver on downlink. An eNB may act as a receiver on uplink and as a transmitter on downlink.

That is, each of the UE and the eNB may include a Tx module 2140 or 2150 and an Rx module 2150 or 2170, for controlling transmission and reception of information, data, and/or messages, and an antenna 2100 or 2110 for transmitting and receiving information, data, and/or messages.

Each of the UE and the eNB may further include a processor 2120 or 2130 for implementing the afore-described embodiments of the present invention and a memory 2180 or 2190 for temporarily or permanently storing operations of the processor.

The embodiments of the present invention may be performed using the components and functions of the UE and the eNB. The apparatuses illustrated in FIG. 21 may further include the configurations of FIGS. 2, 3 and 4. Preferably, the processors may include the configurations of FIGS. 2, 3 and 4.

The processor of the UE may receive a PDCCH signal by monitoring a search space. Particularly, an LTE-A UE may receive a PDCCH without blocking from another LTE UE by blind-decoding an extended CSS.

Particularly, the processor 2120 of the UE may transmit UCI along with a PUSCH signal. That is, the processor of the UE may calculate the numbers of REs for an HARQ-ACK, a CQI, and an RI in the methods expressed as [Equation 1] to [Equation 6]. Therefore, the UE may generate UCI based on the calculated numbers of REs, piggyback UL-SCH data with the UCI, and transmit the UL-SCH to the eNB.

The UE and/or the eNB may determine whether to add a CRC to CQI/PMI information bits and determine a CRC type to be added to the CQI/PMI information bits in the methods illustrated in FIGS. 19 and 20. Accordingly, the UE may add a CRC to the CQI/PMI information bits according to the determined CRC type. The UE may generate UCI by channel-encoding the CRC-attached CQI/PMI information bits. Then the UE may transmit the UCI on a PUSCH to the eNB.

The Tx and Rx modules of the UE and the eNB may perform a packet modulation/demodulation function for data transmission, a high-speed packet channel coding function, OFDMA packet scheduling, TDD packet scheduling, and/or channelization. Each of the UE and the eNB of FIG. 21 may further include a low-power Radio Frequency (RF)/Intermediate Frequency (IF) module.

Meanwhile, the UE may be any of a Personal Digital Assistant (PDA), a cellular phone, a Personal Communication Service (PCS) phone, a Global System for Mobile (GSM) phone, a Wideband Code Division Multiple Access (WCDMA) phone, a Mobile Broadband System (MBS) phone, a handheld PC, a laptop PC, a smart phone, a Multi Mode-Multi Band (MM-MB) terminal, etc.

The smart phone is a terminal taking the advantages of both a mobile phone and a PDA. It incorporates the functions of a PDA, that is, scheduling and data communications such as fax transmission and reception and Internet connection into a mobile phone. The MB-MM terminal refers to a terminal which has a multi-modem chip built therein and which can operate in any of a mobile Internet system and other mobile communication systems (e.g. CDMA 2000, WCDMA, etc.)

Embodiments of the present invention may be achieved by various means, for example, hardware, firmware, software, or a combination thereof.

In a hardware configuration, the methods according to exemplary embodiments of the present invention may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the methods according to the embodiments of the present invention may be implemented in the form of a module, a procedure, a function, etc. performing the above-described functions or operations. A software code may be stored in the memory unit 2180 or 2190 and executed by the processor 2120 or 2130. The memory unit is located at the interior or exterior of the processor and may transmit and receive data to and from the processor via various known means.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present invention or included as a new claim by a subsequent amendment after the application is filed.

INDUSTRIAL APPLICABILITY

The present invention is applicable to various wireless access systems including a 3GPP system, a 3GPP2 system, and/or an IEEE 802.xx system. Besides these wireless access systems, the embodiments of the present invention are applicable to all technical fields in which the wireless access systems find their applications.

The invention claimed is:

1. A method for transmitting channel quality control information in a wireless access system, the method comprising:

attaching, by a user equipment, Cyclic Redundancy Check (CRC) bits to the channel quality control information, taking into account a size of the CRC bits and a size of the channel quality control information;

channel-encoding, by the user equipment, the channel quality control information attached with the CRC bits; and transmitting, by the user equipment, the channel-encoded channel quality control information on a Physical Uplink Shared Channel (PUSCH) to a base station, wherein a size of the CRC bits is 8 bits, when a sum of the size of the channel quality control information and the size of the CRC bits is equal to or less than 128 bits.

2. The method according to claim 1, wherein the channel quality control information includes at least one of Channel Quality Indication (CQI) information and Precoding Matrix Index (PMI) information.

3. The method according to claim 1, wherein if a sum of the size of the channel quality control information and the size of the CRC bits is equal to or larger than 129 bits, the size of the CRC bits is 24 bits.

4. The method according to claim 3, wherein the 24-bit CRC is $g_{Q24A}(D)=[D^{24}+D^{23}+D^{18}+D^{17}+D^{14}+D^{11}+D^{10}+D^{7}+D^{6}+D^{5}+D^{4}+D^{3}+D+1]$, $g_{CRC24B}(D)=[D^{24}+D^{23}+D^{6}+D^{5}+D+1]$.

5. The method according to claim 1, wherein if a sum of the size of the channel quality control information and the size of the CRC bits is equal to or larger than 129, the size of the CRC bits is 16 bits.

6. The method according to claim 5, wherein the 16-bit CRC is $g_{CRC16}(D)=[D^{16}+D^{12}+D^{5}+1]$.

7. A user equipment for transmitting channel quality control information in a wireless access system, the user equipment comprising:

a transmission module configured to transmit a wireless signal;

a reception module configured to receive a wireless signal; and a processor configured to support transmission of the channel quality control information, wherein the processor is configured to:

attach Cyclic Redundancy Check (CRC) bits to the channel quality control information, taking into account a size of the CRC bits and a size of the channel quality control information, and channel-encode the channel quality control information attached with the CRC bits, and wherein the UE transmits the channel-encoded channel quality control information on a Physical Uplink Shared Channel (PUSCH) to a base station by using the transmission module, and wherein a size of the CRC bits is 8 bits, when a sum of the size of the channel quality control information and the size of the CRC bits is equal to or less than 128 bits.

8. The user equipment according to claim 7, wherein the channel quality control information includes at least one of Channel Quality Indication (CQI) information and Precoding Matrix Index (PMI) information.

9. The user equipment according to claim 7, wherein if a sum of the size of the channel quality control information and the size of the CRC bits is equal to or larger than 129 bits, the size of the CRC bits is 24 bits, and the 24-bit CRC is $g_{CRC24A}(D)=[D^{24}+D^{23}+D^{18}+D^{17}+D^{14}+D^{11}+D^{10}+D^{7}+D^{6}+D^{5}+D^{4}+D^{3}+D+1]$, or $g_{CRC24B}(D)=[D^{24}+D^{23}+D^{6}+D^{5}D+1]$.

10. The user equipment according to claim 7, wherein if a sum of the size of the channel quality control information and the size of the CRC bits is equal to or larger than 129 bits, the size of the CRC bits is 16 bits, and the 16-bit CRC is $g_{CRC16}$ (D) $[D^{16}+D^{12}+D^5+1]$.

* * * * *